United States Patent
Miyajima et al.

(10) Patent No.: US 12,094,732 B2
(45) Date of Patent: Sep. 17, 2024

(54) SUBSTRATE PROCESSING METHOD AND SUBSTRATE PROCESSING APPARATUS

(71) Applicant: SCREEN Holdings Co., Ltd., Kyoto (JP)

(72) Inventors: Keisuke Miyajima, Kyoto (JP); Keiji Magara, Kyoto (JP); Takashi Katayama, Kyoto (JP)

(73) Assignee: SCREEN Holdings Co., Ltd., Kyoto (JP)

( * ) Notice: Subject to any disclaimer, the term of this patent is extended or adjusted under 35 U.S.C. 154(b) by 289 days.

(21) Appl. No.: 17/392,217

(22) Filed: Aug. 2, 2021

(65) Prior Publication Data

US 2022/0037173 A1 Feb. 3, 2022

(30) Foreign Application Priority Data

Aug. 3, 2020 (JP) .................................. 2020-131782

(51) Int. Cl.
*H01L 21/67* (2006.01)
*H01L 21/02* (2006.01)

(52) U.S. Cl.
CPC .. *H01L 21/67057* (2013.01); *H01L 21/02052* (2013.01); *H01L 21/67034* (2013.01)

(58) Field of Classification Search
CPC ......... H01L 21/02052; H01L 21/02054; H01L 21/67028; H01L 21/67034; H01L 21/67051; H01L 21/67057
See application file for complete search history.

(56) References Cited

U.S. PATENT DOCUMENTS

| | | |
|---|---|---|
| 6,334,266 B1 | 1/2002 | Moritz et al. |
| 6,779,534 B2 | 8/2004 | Yamaguchi et al. |
| 6,901,685 B2 | 6/2005 | Yamaguchi et al. |
| 2003/0168086 A1 | 9/2003 | Yamaguchi et al. |
| 2004/0226185 A1 | 11/2004 | Yamaguchi et al. |
| 2005/0233922 A1 | 10/2005 | Jung et al. |
| 2007/0000524 A1 | 1/2007 | Kimura |
| 2009/0084405 A1* | 4/2009 | Kimura ............ H01L 21/67028 134/18 |
| 2014/0127908 A1 | 5/2014 | Okutani |
| 2015/0200086 A1 | 7/2015 | Yokoyama |
| 2016/0089696 A1 | 3/2016 | Kimura |
| 2016/0265846 A1* | 9/2016 | Tice .................. H01L 21/67781 |
| 2019/0088469 A1 | 3/2019 | Tanaka et al. |

(Continued)

FOREIGN PATENT DOCUMENTS

| | | |
|---|---|---|
| JP | H1197303 | 4/1999 |
| JP | 2002134461 | 5/2002 |
| JP | 2002280352 | 9/2002 |

(Continued)

*Primary Examiner* — David G Cormier
(74) *Attorney, Agent, or Firm* — JCIPRNET

(57) ABSTRACT

A substrate processing method includes step S51, step S52, and step S6. In step S51, a substrate immersed in a rinsing liquid is lifted from the rinsing liquid and the substrate is immersed in a rinsing liquid stored in a tank in a chamber while an organic solvent having a surface tension smaller than that of the rinsing liquid adheres to the substrate. In step S52, the substrate is lifted from the rinsing liquid. In step S6, a vapor of an organic solvent having a surface tension smaller than that of the rinsing liquid is supplied into the chamber in which the lifted substrate exists.

10 Claims, 10 Drawing Sheets

(56) References Cited

U.S. PATENT DOCUMENTS

2020/0075356 A1* 3/2020 Hsu .................. H01L 21/67057

FOREIGN PATENT DOCUMENTS

| | | |
|---|---|---|
| JP | 2003257926 | 9/2003 |
| JP | 2007012859 | 1/2007 |
| JP | 2015133444 | 7/2015 |
| KR | 100983986 | 9/2010 |
| KR | 20170086443 | 7/2017 |
| TW | 201622836 | 7/2016 |

* cited by examiner

SUBSTRATE PROCESSING METHOD AND SUBSTRATE PROCESSING APPARATUS

CROSS-REFERENCE TO RELATED APPLICATIONS

This application claims priority benefit of Japanese Patent Application No. 2020-131782, filed on Aug. 3, 2020 under Article 119 of the US Patent Law. The entirety of the above-mentioned patent application is hereby incorporated by reference herein and made a part of this specification.

BACKGROUND

Technical Field

The disclosure relates to a substrate processing method and a substrate processing apparatus.

Description of Related Art

In a substrate processing apparatus described in Patent Document 1 (Japanese Patent Laid-Open No. 2007-12859), a substrate is immersed in a processing tank storing a rinsing liquid to clean a surface and the substrate is lifted into a chamber placed in an organic solvent gas atmosphere such as IPA to dry the substrate (for example, Patent Document 1). In this case, the rinsing liquid existing between structures forming a pattern of the substrate surface is replaced with an organic solvent having a low surface tension, so that the collapse of the structure is suppressed.

However, in recent years, the pattern on the substrate surface has been further miniaturized. Therefore, the rinsing liquid existing in the space between the structures on the substrate surface may not be easily replaced by the organic solvent.

SUMMARY

The disclosure provides a substrate processing method and a substrate processing apparatus capable of effectively replacing a rinsing liquid existing in a space between structures formed on a surface of a substrate with an organic solvent.

According to an aspect of the disclosure, a substrate processing method includes: lifting a substrate immersed in a rinsing liquid from the rinsing liquid and immersing the substrate in a rinsing liquid stored in a tank in a chamber while a first organic solvent having a surface tension smaller than that of the rinsing liquid adheres to the substrate; lifting the substrate from the rinsing liquid; and supplying a vapor of a second organic solvent having a surface tension smaller than that of the rinsing liquid into the chamber in which the lifted substrate exists.

The substrate processing method of the disclosure may further include supplying a vapor of the first organic solvent into the chamber before the immersing of the substrate in the rinsing liquid. In the immersing of the substrate in the rinsing liquid, the substrate may be lowered so that the substrate having the first organic solvent adhering thereto is immersed in the rinsing liquid.

In the substrate processing method of the disclosure, a film of the first organic solvent may be formed on a liquid surface of the rinsing liquid by the vapor of the first organic solvent in the supplying of the vapor of the first organic solvent.

The substrate processing method of the disclosure may further include forming a film of the first organic solvent on a liquid surface of the rinsing liquid by directly supplying the first organic solvent to the rinsing liquid stored in the tank before the immersing of the substrate in the rinsing liquid. In the immersing of the substrate in the rinsing liquid, the substrate may be lowered so that the substrate is immersed in the rinsing liquid forming a film of the first organic solvent.

In the substrate processing method of the disclosure, the immersing of the substrate in the rinsing liquid and the lifting of the substrate may be alternately performed a plurality of times.

In the substrate processing method of the disclosure, an ascending speed of the substrate when lifting the substrate from the rinsing liquid may be the smallest in the lifting of the substrate performed finally.

In the substrate processing method of the disclosure, a descending speed of the substrate when immersing the substrate in the rinsing liquid may be larger than an ascending speed of the substrate when lifting the substrate from the rinsing liquid.

According to another aspect of the disclosure, a substrate processing method includes: lifting a substrate immersed in a rinsing liquid from the rinsing liquid and immersing the substrate in a rinsing liquid having a film of a first organic solvent having a surface tension smaller than that of the rinsing liquid on a liquid surface while the substrate passes through the film of the first organic solvent; lifting the substrate from the rinsing liquid while the substrate passes through the film of the first organic solvent; and supplying a vapor of a second organic solvent having a surface tension smaller than that of the rinsing liquid into a chamber in which the lifted substrate exists.

According to still another aspect of the disclosure, a substrate processing apparatus includes a chamber, a tank, a substrate moving section, and a fluid supply section. The tank is disposed in the chamber. The substrate moving section performs an operation in which a substrate immersed in a rinsing liquid is lifted from the rinsing liquid and the substrate is immersed in a rinsing liquid stored in the tank while a first organic solvent having a surface tension smaller than that of the rinsing liquid adheres to the substrate and an operation in which the substrate is lifted from the rinsing liquid. The fluid supply section supplies a vapor of a second organic solvent having a surface tension smaller than that of the rinsing liquid into the chamber in which the substrate lifted from the rinsing liquid by the substrate moving section exists.

In the substrate processing apparatus of the disclosure, the fluid supply section may supply a vapor of the first organic solvent into the chamber before the substrate moving section performs the operation in which the substrate is immersed in the rinsing liquid. The substrate moving section may lower the substrate so that the substrate having the first organic solvent adhering thereto is immersed in the rinsing liquid.

In the substrate processing apparatus of the disclosure, the fluid supply section may form a film of the first organic solvent on a liquid surface of the rinsing liquid by the vapor of the first organic solvent before the substrate moving section performs the operation in which the substrate is immersed in the rinsing liquid.

In the substrate processing apparatus of the disclosure, the fluid supply section may form a film of the first organic solvent on a liquid surface of the rinsing liquid by directly supplying the first organic solvent to the rinsing liquid stored in the tank before the substrate moving section performs the operation in which the substrate is immersed in the rinsing liquid. The substrate moving section may lower the substrate so that the substrate is immersed in the rinsing liquid having the film of the first organic solvent.

In the substrate processing apparatus of the disclosure, the operation in which the substrate is immersed in the rinsing liquid and the operation in which the substrate is lifted from the rinsing liquid may be alternately performed by the substrate moving section a plurality of times.

In the substrate processing apparatus of the disclosure, in the operation in which the substrate moving section lifts the substrate and which is performed finally, an ascending speed of the substrate when the substrate is lifted from the rinsing liquid may be the smallest.

In the substrate processing apparatus of the disclosure, a descending speed of the substrate when the substrate moving section immerses the substrate in the rinsing liquid may be set to be larger than an ascending speed of the substrate when the substrate moving section lifts the substrate from the rinsing liquid.

According to still another aspect of the disclosure, a substrate processing apparatus includes a substrate moving section and a fluid supply section. The substrate moving section performs an operation in which a substrate immersed in a rinsing liquid is lifted from the rinsing liquid and the substrate is immersed in a rinsing liquid having a film of a first organic solvent having a surface tension smaller than that of the rinsing liquid on a liquid surface while the substrate passes through the film of the first organic solvent and an operation in which the substrate is lifted from the rinsing liquid while the substrate passes through the film of the first organic solvent. The fluid supply section supplies a vapor of a second organic solvent having a surface tension smaller than that of the rinsing liquid into a chamber in which the substrate lifted from the rinsing liquid by the substrate moving section exists.

Figure 6:
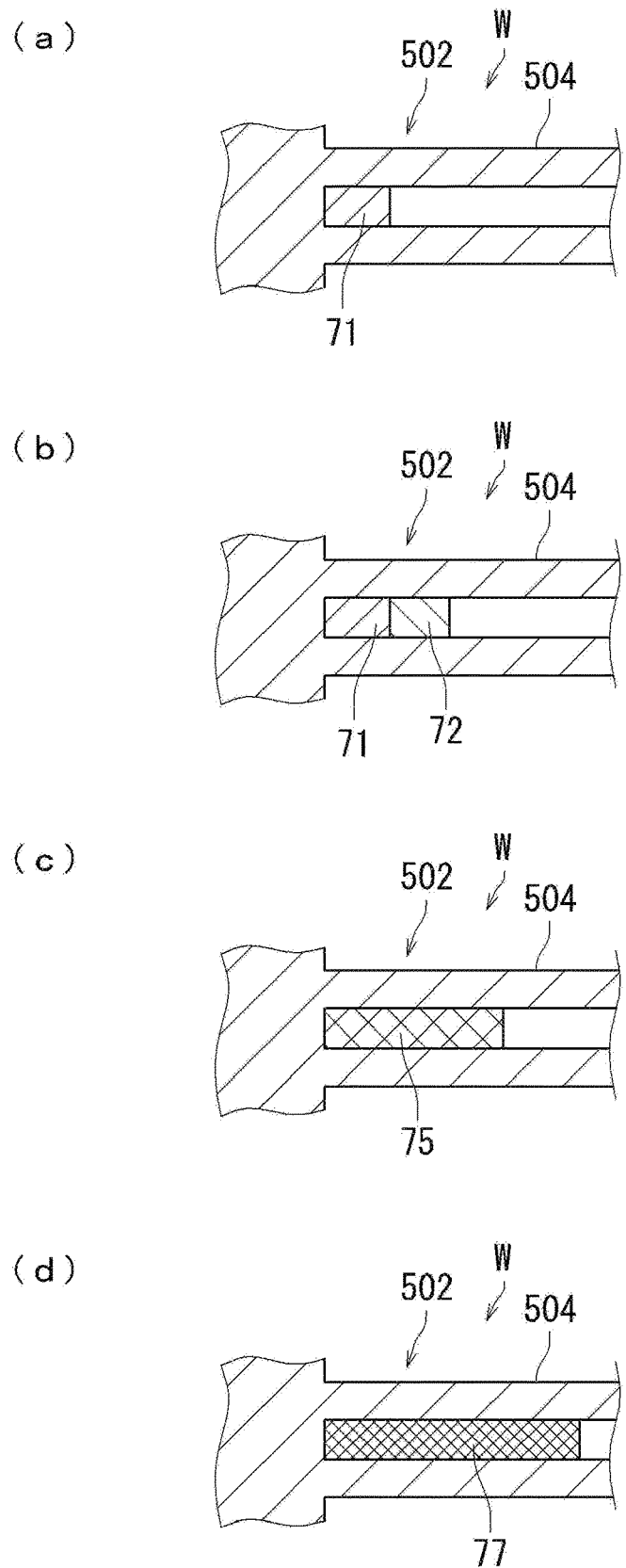

(a) to (d) of FIG. 6 are diagrams showing a principle that a rinsing liquid is replaced with an organic solvent in the substrate processing apparatus according to the first embodiment.

Figure 7:
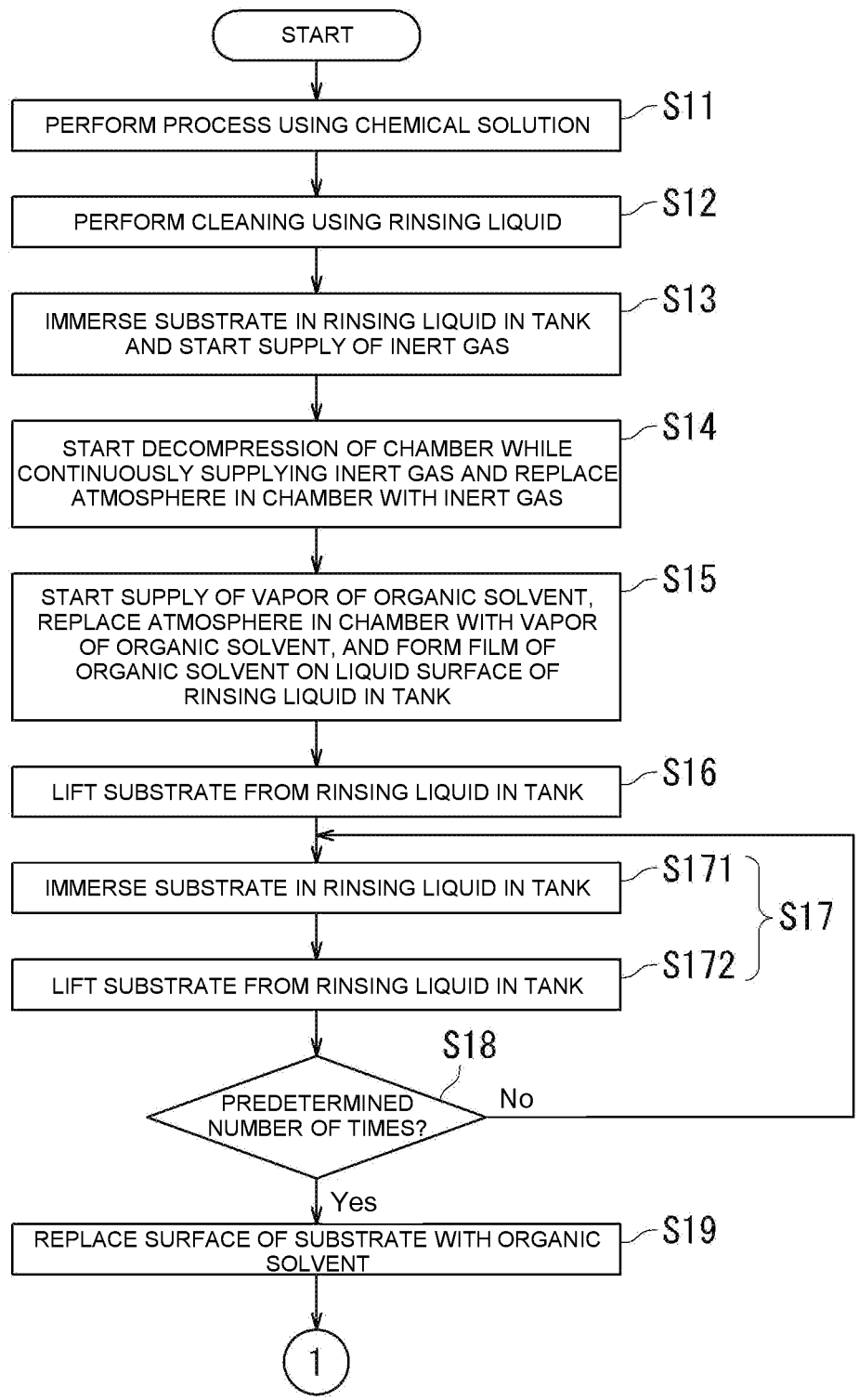

FIG. 7 is a flowchart showing a front stage of another example of the substrate processing method which is performed by the substrate processing apparatus according to the first embodiment.

Figure 8:
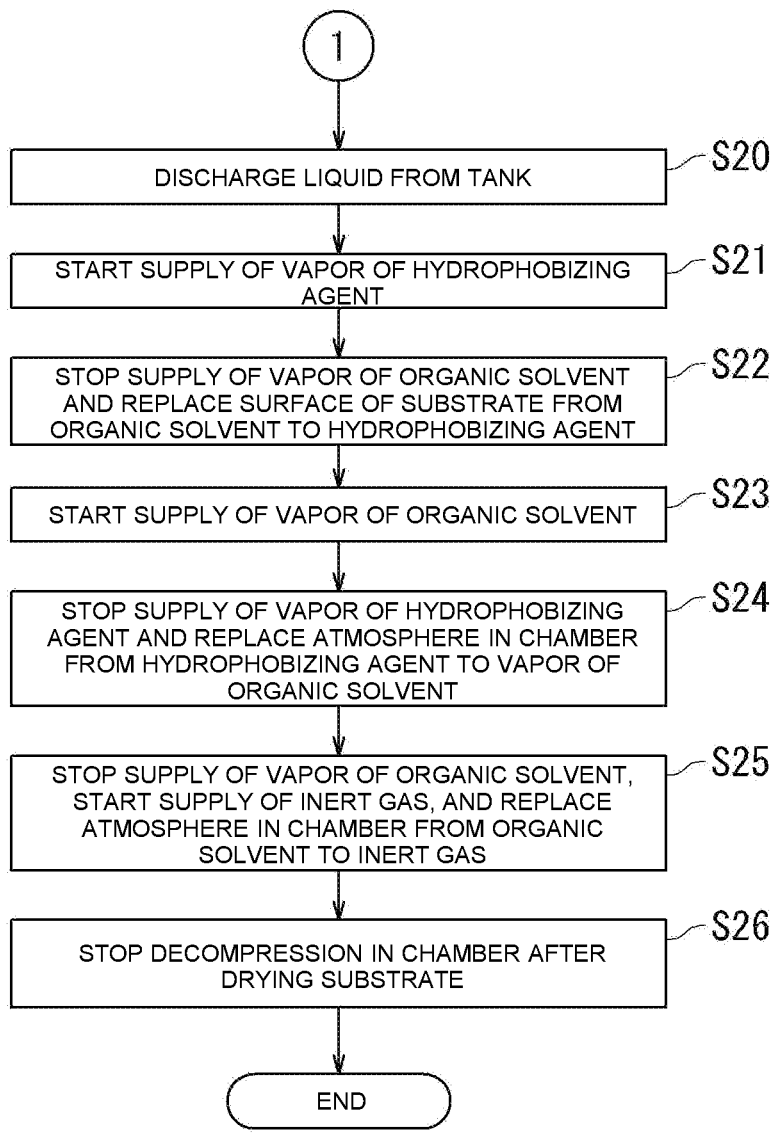

FIG. 8 is a flowchart showing a rear stage of another example of the substrate processing method which is performed by the substrate processing apparatus according to the first embodiment.

Figure 9:
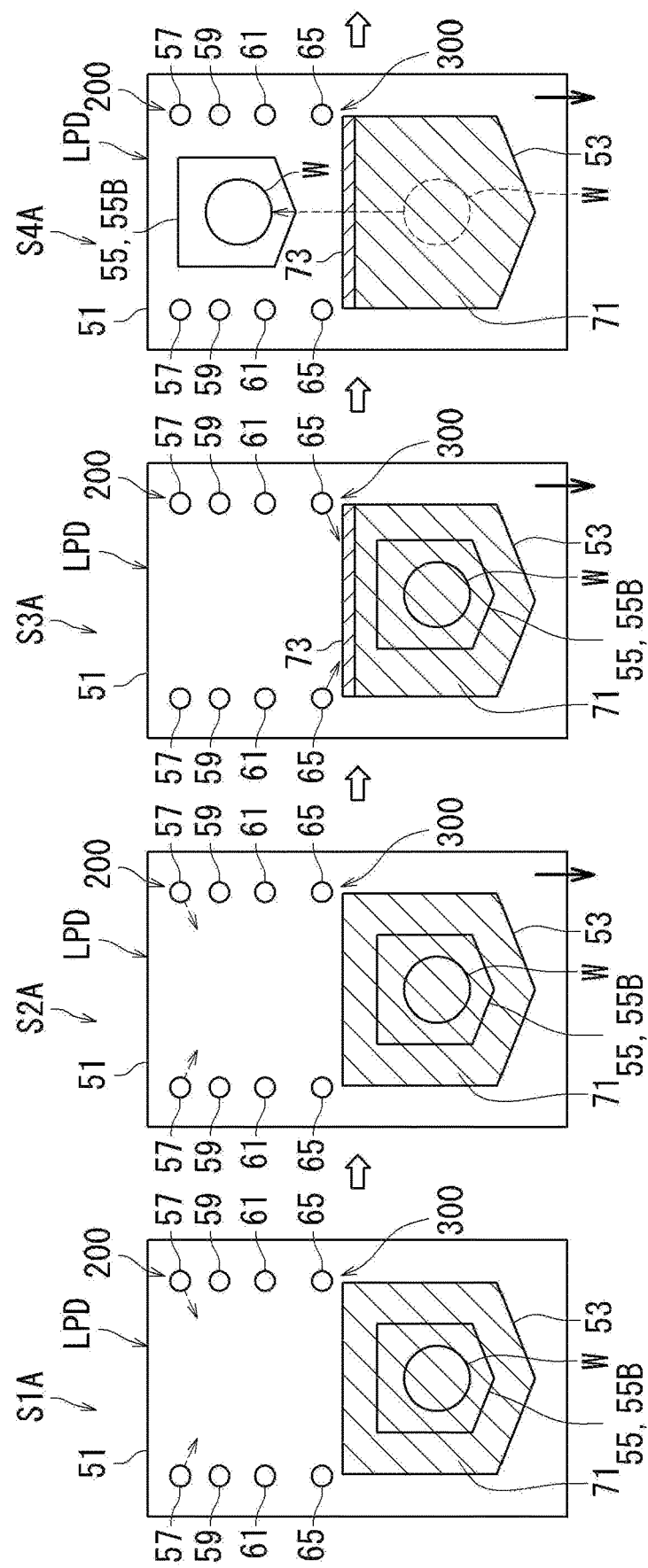

FIG. 9 is a sequence diagram showing a front stage of a substrate processing method which is performed by a substrate processing apparatus according to a second embodiment of the disclosure.

Figure 10:
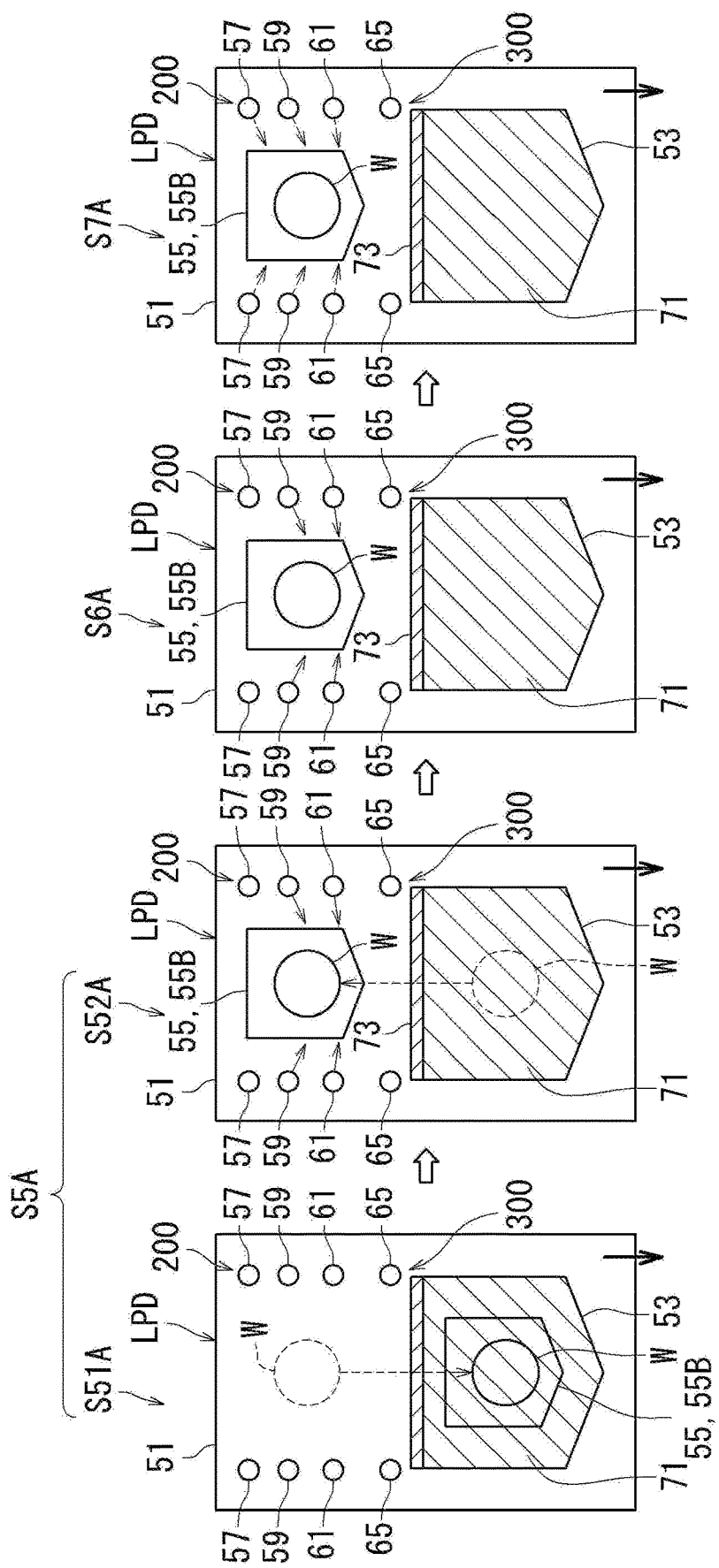

FIG. 10 is a sequence diagram showing a rear stage of the substrate processing method which is performed by the substrate processing apparatus according to the second embodiment.

DESCRIPTION OF THE EMBODIMENTS

Hereinafter, embodiments of the disclosure will be described with reference to the drawings. In the drawings, the same or corresponding parts are designated by the same reference numerals and the description is not repeated. Further, in the embodiments of the disclosure, the X axis, the Y axis, and the Z axis are orthogonal to each other, the X axis and the Y axis are parallel in the horizontal direction, and the Z axis is parallel in the vertical direction.

First Embodiment

A substrate processing apparatus 1000 and a substrate processing method according to a first embodiment of the disclosure will be described with reference to FIGS. 1 to 8. The substrate processing apparatus 1000 according to the first embodiment is a batch type. Thus, the substrate processing apparatus 1000 processes a plurality of substrates W at once. Specifically, the substrate processing apparatus 1000 processes a plurality of lots. Each of the plurality of lots includes the plurality of substrates W. For example, one lot includes twenty-five substrates W. The substrate W has, for example, a substantially disk shape.

The substrate W is, for example, a semiconductor wafer, a substrate for a liquid crystal display device, a substrate for a plasma display, a substrate for a field emission display (FED), a substrate for an optical disk, a substrate for a magnetic disk, a substrate for a magneto-optical disk, a substrate for a photomask, a ceramic substrate, or a substrate for a solar cell. The semiconductor wafer has, for example, a pattern for forming a three-dimensional flash memory (for example, a three-dimensional NAND flash memory). In the following description, as an example, the substrate W is a semiconductor wafer.

Figure 1:
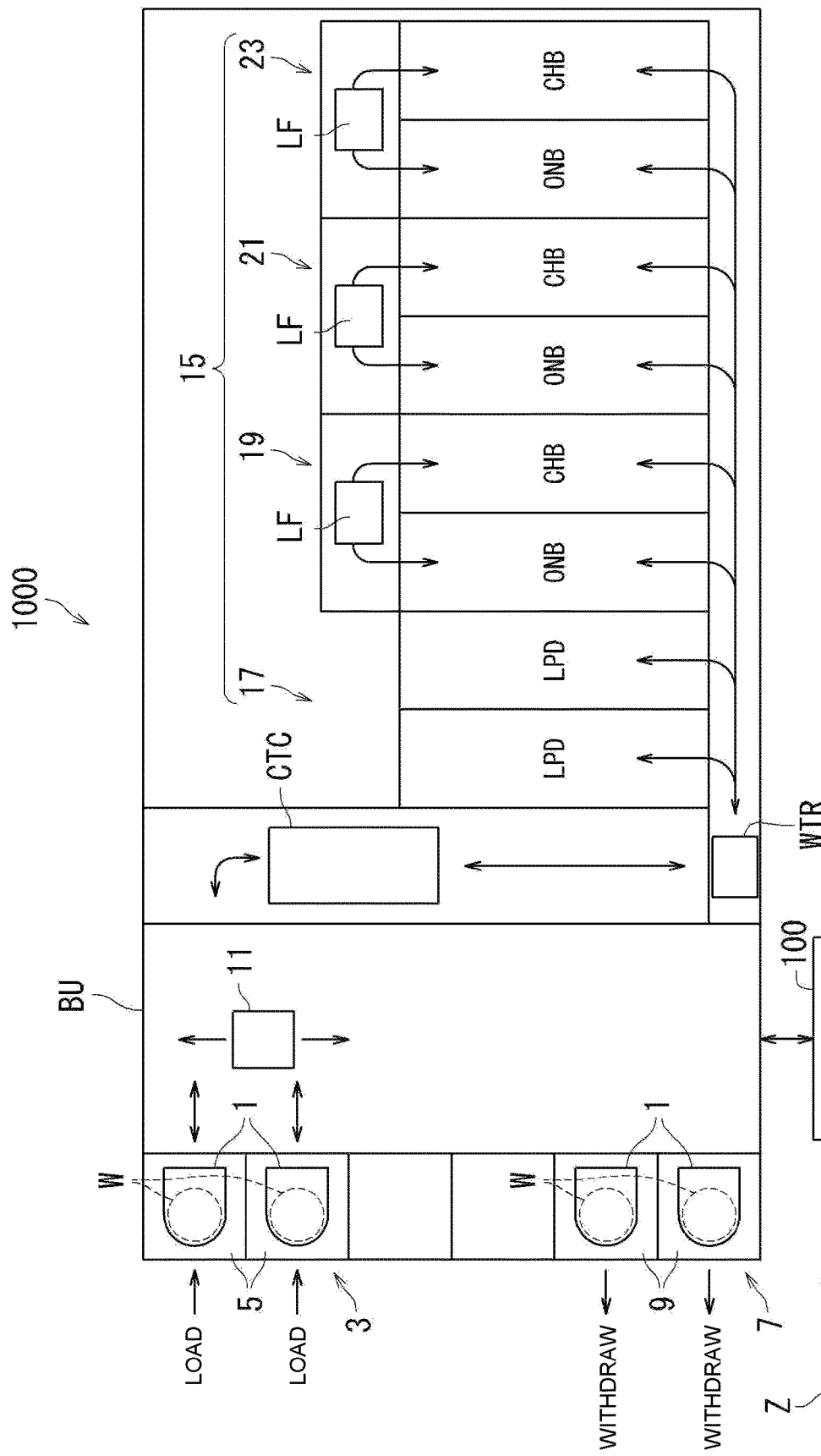
FIG. 1 is a plan view showing the inside of a substrate processing apparatus according to a first embodiment of the disclosure.

First, the substrate processing apparatus 1000 will be described with reference to FIG. 1. FIG. 1 is a plan view showing the inside of the substrate processing apparatus 1000. As shown in FIG. 1, the substrate processing apparatus 1000 includes a plurality of storage sections 1, a loading section 3, a withdrawing section 7, a delivery mechanism 11, a buffer unit BU, a first transfer mechanism CTC, a second transfer mechanism WTR, a processing section 15, and a control device 100.

The processing section 15 includes a drying processing section 17. The processing section 15 may include a first processing section 19, a second processing section 21, and a third processing section 23. The drying processing section 17 includes at least one drying tank unit LPD. The first processing section 19, the second processing section 21, and the third processing section 23 respectively include a tank unit ONB, a tank unit CHB, and a transfer mechanism LF.

Each of the plurality of storage sections 1 stores the plurality of substrates W. Each substrate W is stored in the storage section 1 in a horizontal posture. The storage section 1 is, for example, a front opening unified pod (FOUP).

The storage section 1 placed on the loading section 3 stores the substrate W which is not processed by the processing section 15. Specifically, the loading section 3 includes a plurality of placement bases 5. Then, two storage sections 1 are respectively placed on two placement bases 5.

The storage section 1 placed on the withdrawing section 7 stores the substrate W which is processed by the processing section 15. Specifically, the withdrawing section 7 includes a plurality of placement bases 9. Then, two storage sections 1 are respectively placed on two placement bases 9. The withdrawing section 7 stores the processed substrate W in the storage section 1 and withdraws the substrate together with the storage section 1.

The buffer unit BU is disposed adjacent to the loading section 3 and the withdrawing section 7. The buffer unit BU takes the storage section 1 placed on the loading section 3 together with the substrate W and places the storage section 1 on a shelf (not shown). Further, the buffer unit BU receives the processed substrate W, stores the substrate in the storage section 1, and places the storage section 1 on the shelf. The delivery mechanism 11 is disposed in the buffer unit BU.

The delivery mechanism 11 delivers the storage section 1 between the loading section 3, the withdrawing section 7, and the shelf. Further, the delivery mechanism 11 delivers only the substrate W to the first transfer mechanism CTC. That is, the delivery mechanism 11 delivers the lot to the first transfer mechanism CTC.

The first transfer mechanism CTC receives the unprocessed lot from the delivery mechanism 11, changes the postures of the plurality of substrates W of the lot from the horizontal posture to the vertical posture, and delivers the lot to the second transfer mechanism WTR. Further, the first transfer mechanism CTC receives the processed lot from the second transfer mechanism WTR, changes the postures of the plurality of substrates W of the lot from the vertical posture to the horizontal posture, and delivers the lot to the delivery mechanism 11.

The second transfer mechanism WTR can move from the drying processing section 17 to the third processing section 23 along the longitudinal direction of the substrate processing apparatus 1000. Thus, the second transfer mechanism WTR carries the lot into and out of each of the drying tank units LPD of the drying processing section 17, each of the tank units ONB and CHB of the first processing section 19, each of the tank units ONB and CHB of the second processing section 21, and each of the tank units ONB and CHB of the third processing section 23.

In the drying processing section 17, the drying tank unit LPD stores the lot and performs a drying process on the plurality of substrates W of the lot.

The first processing section 19 is disposed adjacent to the drying processing section 17. In the first processing section 19, each of the tank unit ONB and the tank unit CHB includes a tank (not shown). Then, the tank units ONB and CHB immerse the substrate W in the chemical solution stored in the tank to process the plurality of substrates W of the lot by the chemical solution. Alternatively, the tank units ONB and CHB immerse the substrate W in the rinsing liquid stored in the tank to clean the plurality of substrates W of the lot by the rinsing liquid.

The chemical solution is, for example, dilute hydrofluoric acid (DHF), hydrofluoric acid (HF), hydrofluoric acid (mixture of hydrofluoric acid and nitric acid ($HNO_3$)), buffered hydrofluoric acid (BHF), ammonium fluoride, mixture of hydrofluoric acid and ethylene glycol (HFEG), phosphoric acid ($H_3PO_4$), sulfuric acid, acetic acid, nitric acid, hydrochloric acid, aqueous ammonia, hydrogen peroxide solution, organic acids (eg citric acid, oxalic acid), organic alkali (eg TMAH: tetramethylammonium hydroxide), sulfuric acid hydrogen peroxide mixture (SPM), ammonia hydrogen peroxide mixture (SC1), sulfuric acid hydrogen peroxide mixture (SC2), isopropyl alcohol (IPA), surfactant, corrosion inhibitor, or hydrophobizing agent.

In the present specification, the rinsing liquid is one of pure water (DIW: Deionized Water), carbonated water, electrolytic ionized water, hydrogen water, ozone water, and hydrochloric acid water having a diluted concentration (for example, about 10 ppm to 100 ppm). Pure water is deionized water.

Further, in the first processing section 19, the transfer mechanism LF delivers the lot to the second transfer mechanism WTR other than the transfer of the lot in the first processing section 19. Further, the transfer mechanism LF immerses each substrate W of the lot in the tanks of the tank units ONB and CHB or lifts each substrate W of the lot from the tanks of the tank units ONB and CHB.

The tank units ONB and CHB of the second processing section 21 adjacent to the first processing section 19 and the tank units ONB and CHB of the third processing section 23 adjacent to the second processing section 21 have the same configurations as those of the tank units ONB and CHB of the first processing section 19.

The control device 100 controls the delivery mechanism 11, the first transfer mechanism CTC, the second transfer mechanism WTR, and the processing section 15. The control device 100 is, for example, a computer. Specifically, the control device 100 includes a processor and a storage device. The processor includes, for example, a central processing section unit (CPU). The storage device stores data and a computer program. The storage device includes, for example, a main storage device such as a semiconductor memory and an auxiliary storage device such as a semiconductor memory, a solid-state drive, and/or a hard disk drive. The storage device may include removable media. The storage device corresponds to an example of a non-temporary computer-readable storage medium.

The processor of the control device 100 controls the delivery mechanism 11, the first transfer mechanism CTC, the second transfer mechanism WTR, and the processing section 15 by executing a computer program stored in the storage device.

Figure 2:
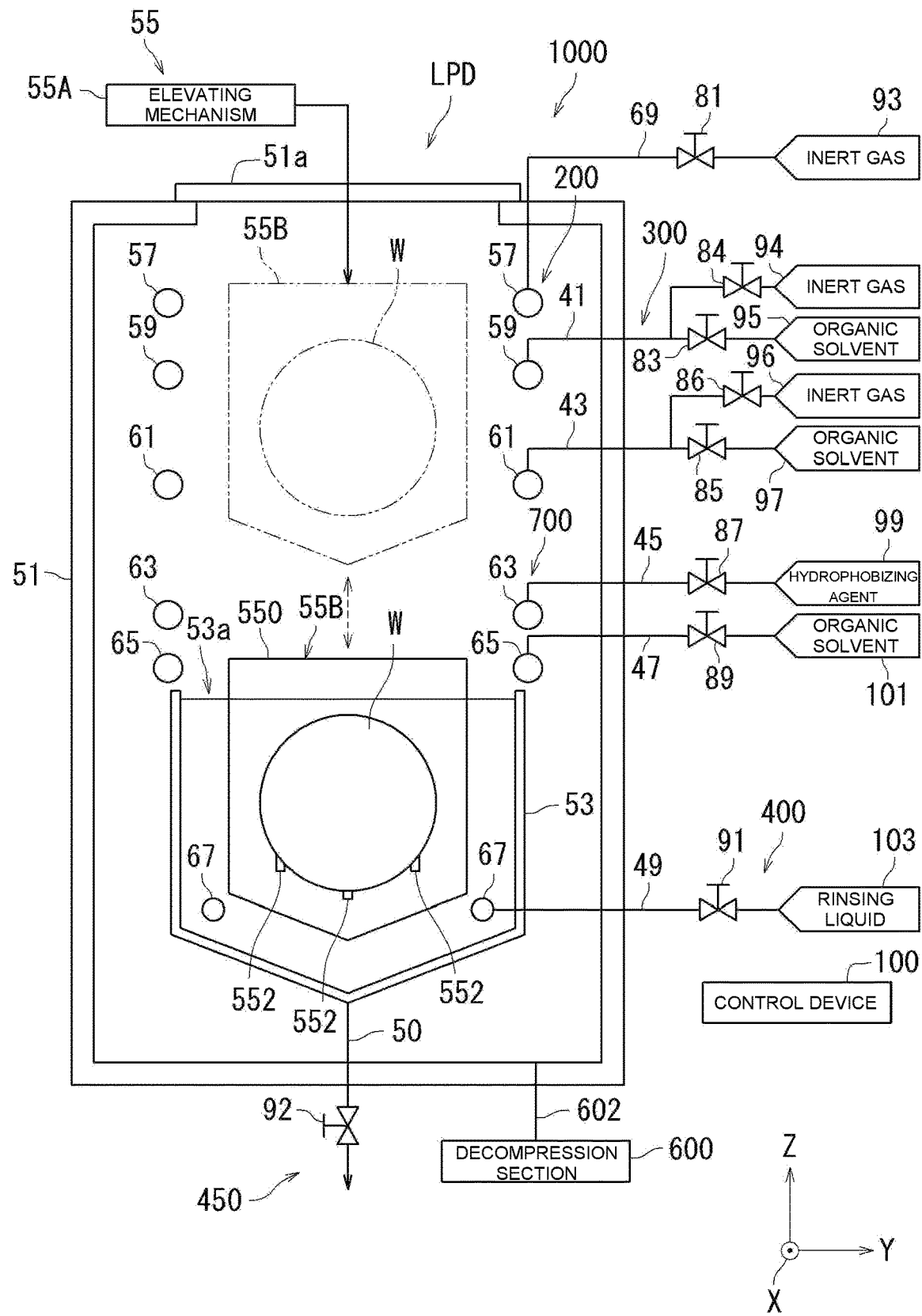
FIG. 2 is a side view showing the inside of a drying tank unit in the substrate processing apparatus according to the first embodiment.

Next, the drying tank unit LPD will be described with reference to FIG. 2. In the first embodiment, the drying tank unit LPD performs a drying process based on a decompression lifting type drying method using a vapor of a water-soluble organic solvent. FIG. 2 is a side view showing the inside of the drying tank unit LPD.

As shown in FIG. 2, the drying tank unit LPD includes a chamber 51, a tank 53, a substrate moving section 55, an inert gas supply section 200, a fluid supply section 300, a rinsing liquid supply section 400, a drainage section 450, and a decompression section 600. The drying tank unit LPD may further include a hydrophobizing agent supply section 700.

The substrate moving section 55 includes an elevating mechanism 55A and a substrate holding section 55B. The inert gas supply section 200 includes at least one nozzle 57 (for example, a plurality of nozzles 57), a pipe 69, and a valve 81. The fluid supply section 300 includes at least one nozzle 59 (for example, a plurality of nozzles 59), a pipe 41, valves 83 and 84, at least one nozzle 61 (for example, a plurality of nozzles 61), a pipe 43, and valves 85 and 86. The fluid supply section 300 may include at least one nozzle 65 (for example, a plurality of nozzles 65), a pipe 47, and a valve 89. The rinsing liquid supply section 400 includes at least one nozzle 67 (for example, a plurality of nozzles 67), a pipe 49, and a valve 91. The drainage section 450 includes a pipe 50 and a valve 92. The hydrophobizing agent supply section 700 includes at least one nozzle 63 (for example, a plurality of nozzles 63), a pipe 45, and a valve 87.

The chamber 51 stores the tank 53, the substrate holding section 55B, and the nozzles 57, 59, 61, 63, 65, and 67. The chamber 51 has, for example, a substantially box shape. The chamber 51 includes a cover 51a. The cover 51a is disposed on the upper opening of the chamber 51. The cover 51a can be opened and closed.

The tank 53 is a container which stores the rinsing liquid. In the first embodiment, the rinsing liquid is DIW. The tank 53 cleans the substrate W by immersing the substrate W in, for example, the rinsing liquid.

In the rinsing liquid supply section 400, the plurality of nozzles 67 is disposed in the tank 53. The plurality of nozzles 67 is connected to the pipe 49. The valve 91 is disposed in the pipe 49. The pipe 49 is connected to a rinsing liquid supply source 103 through the valve 91. Thus, when the control device 100 opens the valve 91, the rinsing liquid is supplied from the rinsing liquid supply source 103 to the plurality of nozzles 67 through the pipe 49. As a result, the plurality of nozzles 67 supplies the rinsing liquid to the tank 53.

The drainage section 450 discharges the rinsing liquid from the tank 53. Specifically, the pipe 50 of the drainage section 450 is connected to the bottom portion of the tank 53. The valve 92 is disposed in the pipe 50. When the control device 100 opens the valve 92, the rinsing liquid in the tank 53 is discharged through the pipe 50.

The substrate moving section 55 lowers the substrate W so that the substrate W is immersed in the rinsing liquid in the tank 53. Alternatively, the substrate moving section 55 raises the substrate W so that the substrate W is lifted from the rinsing liquid in the tank 53.

Specifically, in the substrate moving section 55, the substrate holding section 55B holds the plurality of substrates W. The substrate holding section 55B includes a main body 550 and a plurality of holding rods 552. The main body 550 has, for example, a substantially flat plate shape and extends along the vertical direction. The plurality of holding rods 552 holds the plurality of substrates W in the upright posture. Specifically, the plurality of holding rods 552 extends along a direction (hereinafter, referred to as the "X-axis direction") substantially perpendicular to the main body 550. Thus, the plurality of holding rods 552 holds the plurality of substrates W arranged at equal intervals in the X-axis direction in the upright posture.

Further, the elevating mechanism 55A is controlled by the control device 100 to raise or lower the substrate holding section 55B. Specifically, the elevating mechanism 55A raises or lowers the substrate holding section 55B so that the plurality of substrates W held by the substrate holding section 55B moves between a position in which the substrate is immersed in the rinsing liquid in the tank 53 and a position in which the substrate is lifted from the rinsing liquid in the tank 53. The elevating mechanism 55A includes, for example, a ball screw mechanism and a motor, or a cylinder.

In the inert gas supply section 200, the plurality of nozzles 57 is arranged inside the chamber 51 and outside the tank 53. The plurality of nozzles 57 is connected to the pipe 69. The valve 81 is disposed in the pipe 69. The pipe 69 is connected to an inert gas supply source 93 through the valve 81. Thus, when the control device 100 opens the valve 81, the inert gas is supplied from the inert gas supply source 93 to the plurality of nozzles 57 through the pipe 69. As a result, the plurality of nozzles 57 supplies the inert gas into the chamber 51. In the present specification, the inert gas is nitrogen or argon. In the first embodiment, the inert gas is nitrogen.

In the fluid supply section 300, the plurality of nozzles 59 is arranged inside the chamber 51 and outside the tank 53. The plurality of nozzles 59 is connected to the pipe 41. The valves 83 and 84 are arranged in the pipe 41. The pipe 41 is connected to an organic solvent supply source 95 through the valve 83. Further, the pipe 41 is connected to an inert gas supply source 94 through the valve 84.

Thus, when the control device 100 opens the valve 83 and closes the valve 84, the vapor of the organic solvent is supplied from the organic solvent supply source 95 to the plurality of nozzles 59 through the pipe 41. As a result, the plurality of nozzles 59 supplies the vapor of the organic solvent into the chamber 51. In the present specification, the organic solvent is water-soluble and has a surface tension smaller than that of the rinsing liquid. For example, the organic solvent is a low carbon monohydric alcohol, ethylene glycol, or a lower ketone. The low carbon monohydric alcohol is, for example, methanol, ethanol, or isopropyl alcohol (IPA). In the first embodiment, the organic solvent is IPA.

On the other hand, when the control device 100 closes the valve 83 and opens the valve 84, the inert gas is supplied from the inert gas supply source 94 to the plurality of nozzles 59 through the pipe 41. As a result, the plurality of nozzles 59 supplies the inert gas into the chamber 51.

In the fluid supply section 300, the plurality of nozzles 61 is arranged inside the chamber 51 and outside the tank 53. The plurality of nozzles 61 is connected to the pipe 43. The valves 85 and 86 are arranged in the pipe 43. The pipe 43 is connected to an organic solvent supply source 97 through the valve 85. Further, the pipe 43 is connected to an inert gas supply source 96 through the valve 86.

Thus, when the control device 100 opens the valve 85 and closes the valve 86, the vapor of the organic solvent is supplied from the organic solvent supply source 97 to the plurality of nozzles 61 through the pipe 43. As a result, the plurality of nozzles 61 supplies the vapor of the organic solvent into the chamber 51. On the other hand, when the control device 100 closes the valve 85 and opens the valve 86, the inert gas is supplied from the inert gas supply source 96 to the plurality of nozzles 61 through the pipe 43. As a result, the plurality of nozzles 61 supplies the inert gas into the chamber 51.

In the fluid supply section 300, the plurality of nozzles 65 is arranged inside the chamber 51 and outside the tank 53. In the example of FIG. 2, each of the plurality of nozzles 65 is a shower nozzle. That is, each of the plurality of nozzles 65 is a hollow tubular member extending along the X-axis direction. Then, each of the plurality of nozzles 65 includes a plurality of supply holes (not shown) arranged at equal intervals along the X-axis direction. Each of the plurality of nozzles 65 is disposed, for example, in the vicinity of the upper edge of the tank 53 along the upper edge of the tank 53.

The plurality of nozzles 65 is connected to the pipe 47. The valve 89 is disposed in the pipe 47. The pipe 47 is connected to the organic solvent supply source 101 through the valve 89. Thus, when the control device 100 opens the valve 89, the liquid of the organic solvent is supplied from the organic solvent supply source 101 to the plurality of nozzles 65 through the pipe 47. As a result, the plurality of nozzles 65 supplies the liquid of the organic solvent toward the opening 53a of the tank 53. In the first embodiment, the plurality of nozzles 65 supplies the liquid of the organic solvent to the rinsing liquid in the tank 53. Specifically, the plurality of nozzles 65 supplies the liquid of the organic solvent to the liquid surface of the rinsing liquid in the tank 53.

The decompression section 600 is connected to the chamber 51 through the pipe 602. In a state in which the cover 51a is closed and the inside of the chamber 51 becomes a closed space, the decompression section 600 is controlled by the control device 100 so that the gas in the chamber 51 is discharged to decompress the inside of the chamber 51 to be smaller than an atmospheric pressure. The decompression section 600 includes, for example, an exhaust pump.

In the hydrophobizing agent supply section 700, the plurality of nozzles 63 is arranged inside the chamber 51 and outside the tank 53. In the example of FIG. 2, each of the plurality of nozzles 63 is a hollow tubular member extending along the X-axis direction. Then, each of the plurality of nozzles 63 includes a plurality of supply holes (not shown) arranged at equal intervals along the X-axis direction. The plurality of nozzles 63 is connected to the pipe 45. The valve 87 is disposed in the pipe 45. The pipe 45 is connected to the hydrophobizing agent supply source 99 through the valve 87. Thus, when the control device 100 opens the valve 87, the vapor of the hydrophobizing agent is supplied from the hydrophobizing agent supply source 99 to the plurality of nozzles 63 through the pipe 45. As a result, the plurality of nozzles 63 supplies the vapor of the hydrophobizing agent toward the opening 53a of the tank 53.

The hydrophobizing agent is, for example, a liquid. The hydrophobizing agent is a silicon-based hydrophobizing agent or a metal-based hydrophobizing agent. The silicon-based hydrophobizing agent hydrophobicizes silicon itself and compounds containing silicon. The silicon-based hydrophobizing agent is, for example, a silane coupling agent. The silane coupling agent contains, for example, at least one of hexamethyldisilazane (HMDS), tetramethylsilane (TMS), fluorinated alkylchlorosilane, alkyldisilazane, and a non-chlorohydrophobic agent. The non-chlorohydrophobic agent contains, for example, at least one of dimethylsilyldimethylamine, dimethylsilyldiethylamine, hexamethyldisilazane, tetramethyldisilazane, bis (dimethylamino) dimethylsilane, N, N-dimethylaminotrimethylsilane, N-(trimethylsilyl) dimethylamine, and organosilane compounds. The metal-based hydrophobizing agent hydrophobicizes metal itself and compounds containing metal. The metal-based hydrophobizing agent contains, for example, an amine having a hydrophobic group and at least one of an organic silicon compound.

Additionally, all or part of the inert gas supply sources 93, 94, and 96 may be common or may be provided separately. Further, the organic solvent supply sources 95 and 97 may be common or may be provided separately. Further, the fluid supply section 300 may include any one of a fluid supply unit including the plurality of nozzles 59, the pipe 41, and the valves 83 and 84 and a fluid supply unit including the plurality of nozzles 61, the pipe 43, and the valves 85 and 86. Further, the fluid supply section 300 may include three or more fluid supply units. Further, the fluid supply section 300 can switch the supply of the inert gas and the supply of the vapor of the organic solvent, but may supply only the vapor of the organic solvent.

Figure 3:
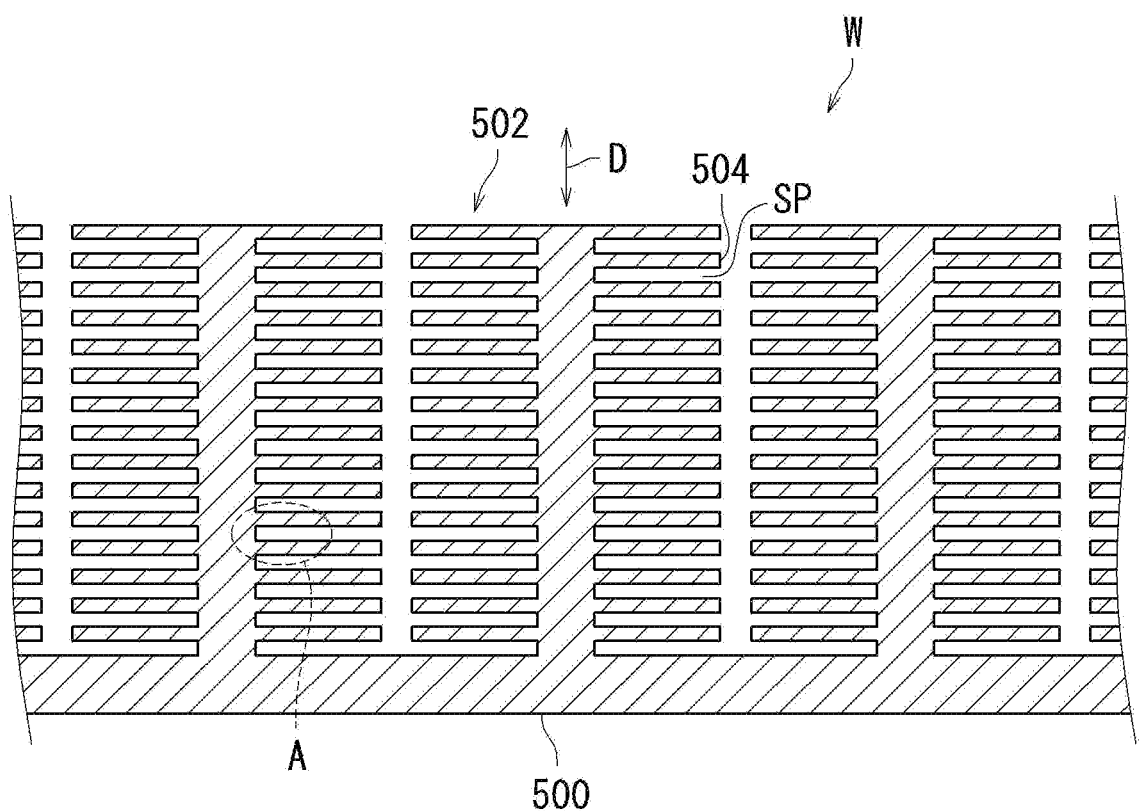
FIG. 3 is a schematic cross-sectional view showing a part of a substrate to be processed by the substrate processing apparatus according to the first embodiment.

Next, an example of the substrate W will be described with reference to FIG. 3. FIG. 3 is a cross-sectional view showing a part of the substrate W to be processed by the substrate processing apparatus 1000. In FIG. 3, a part of the surface of the substrate W is enlarged and shown.

As shown in FIG. 1, a pattern 502 is formed on the surface of the substrate W. Specifically, the substrate W includes a substrate body 500 and a pattern 502. The pattern 502 is, for example, a fine pattern. The pattern 502 includes a plurality of structures 504. The structure 504 is, for example, a microstructure.

In the example of FIG. 1, the plurality of structures 504 are arranged at intervals along a certain direction D. Thus, a space SP is formed between the structure 504 and the structure 504 which are adjacent to each other in the certain direction D.

In the first embodiment, the collapse of the structure 504 at the time of drying the substrate W is suppressed by replacing the rinsing liquid remaining the space SP between the structures 504 with the organic solvent having a surface tension smaller than that of the rinsing liquid after the substrate W is cleaned by the rinsing liquid. In this case, the collapse of the structure 504 is effectively suppressed by effectively replacing the rinsing liquid existing in the space SP between the structures 504 with the organic solvent.

In particular, the inventor of the present application has focused on the physical phenomenon when the rinsing liquid is replaced with an organic solvent. Then, the inventor of the present application conducted a basic experiment and obtained a new finding regarding a physical phenomenon when replacing the rinsing liquid with an organic solvent.

Specifically, as basic experiments, the first experiment, the second experiment, and the third experiment were performed. In the first experiment to the third experiment, DIW was used as the rinsing liquid. The DIW was transparent. The IPA was used as a water-soluble organic solvent. The IPA was colored red with oil-based ink.

In the first experiment, first, 100 ml of DIW was put in a beaker. The DIW in this case was 100% DIW. That is, the IPA concentration was 0%. Next, IPA was poured into the DIW in the beaker. The IPA in this case was 100% IPA. That is, the IPA concentration was about 100%. The IPA with a concentration of about 100% is an example of a high concentration IPA. In the first experiment, it was confirmed that the high concentration IPA was difficult to be mixed with DIW.

As a result, the inventor of the present application has speculated that the DIW may be difficult to be replaced with the high concentration IPA when the DIW remains in the space SP between the structures 504 of the substrate W and the high concentration IPA invades the space SP.

In the second experiment, first, 50 ml of DIW and 50 ml of IPA were stirred to prepare a diluted IPA having an IPA concentration of about 50%. Then, 100 ml of diluted IPA was put in a beaker. Next, IPA was poured into the diluted IPA in the beaker. The IPA in this case was 100% IPA. That is, the IPA concentration was about 100%. In the second experiment, the high concentration IPA was rapidly mixed with the diluted IPA as compared with the first experiment.

As a result, the inventor of the present application has speculated that the high concentration IPA is rapidly mixed with the diluted IPA even when the high concentration IPA invades the space SP if the diluted IPA exists in the space SP between the structures 504 of the substrate W.

The inventor of the present application obtained the following findings as a result of the second experiment. That is, when the rinsing liquid remains in the space SP between the structures 504 of the substrate W, the rinsing liquid of the space SP between the structures 504 is first replaced with the diluted organic solvent. Next, the high concentration organic solvent invades the space SP in which the diluted organic solvent is formed, so that the high concentration organic solvent is mixed with the diluted organic solvent and the high concentration organic solvent is formed in the space SP between the structures 504. As a result, the rinsing liquid remaining in the space SP between the structures 504 can be rapidly replaced with the high concentration organic solvent. Thus, it is possible to effectively suppress the collapse of the structure 504 at the time of drying the substrate W.

In the third experiment, first, 100 ml of DIW was put in a beaker. This point was the same as in the first experiment. Next, 50 ml of DIW and 50 ml of IPA were stirred to prepare a diluted IPA having an IPA concentration of about 50%. Next, 100 ml of diluted IPA was poured into the DIW in the beaker. In the third experiment, the diluted IPA was rapidly mixed with the DIW as compared with the first experiment.

As a result, the inventor of the present application has speculated that the DIW can be rapidly mixed with the diluted IPA by causing the diluted IPA to invade the space SP when the DIW remains in the space SP between the structures 504 of the substrate W.

The inventor of the present application obtained the following findings as a result of the third experiment. That is, when the rinsing liquid remains in the space SP between the structures 504 of the substrate W, the diluted organic solvent first invades the space SP between the structures 504 so that the rinsing liquid and the diluted organic solvent are mixed and the rinsing liquid is replaced with the diluted organic solvent. Next, the high concentration organic solvent invades the space SP in which the diluted organic solvent exists so that the high concentration organic solvent is mixed with the diluted organic solvent and the high concentration organic solvent is formed in the space SP between the structures 504. As a result, the rinsing liquid remaining in the space SP between the structures 504 can be rapidly replaced with the high concentration organic solvent. Thus, it is possible to effectively suppress the collapse of the structure 504 at the time of drying the substrate W.

Figure 4:
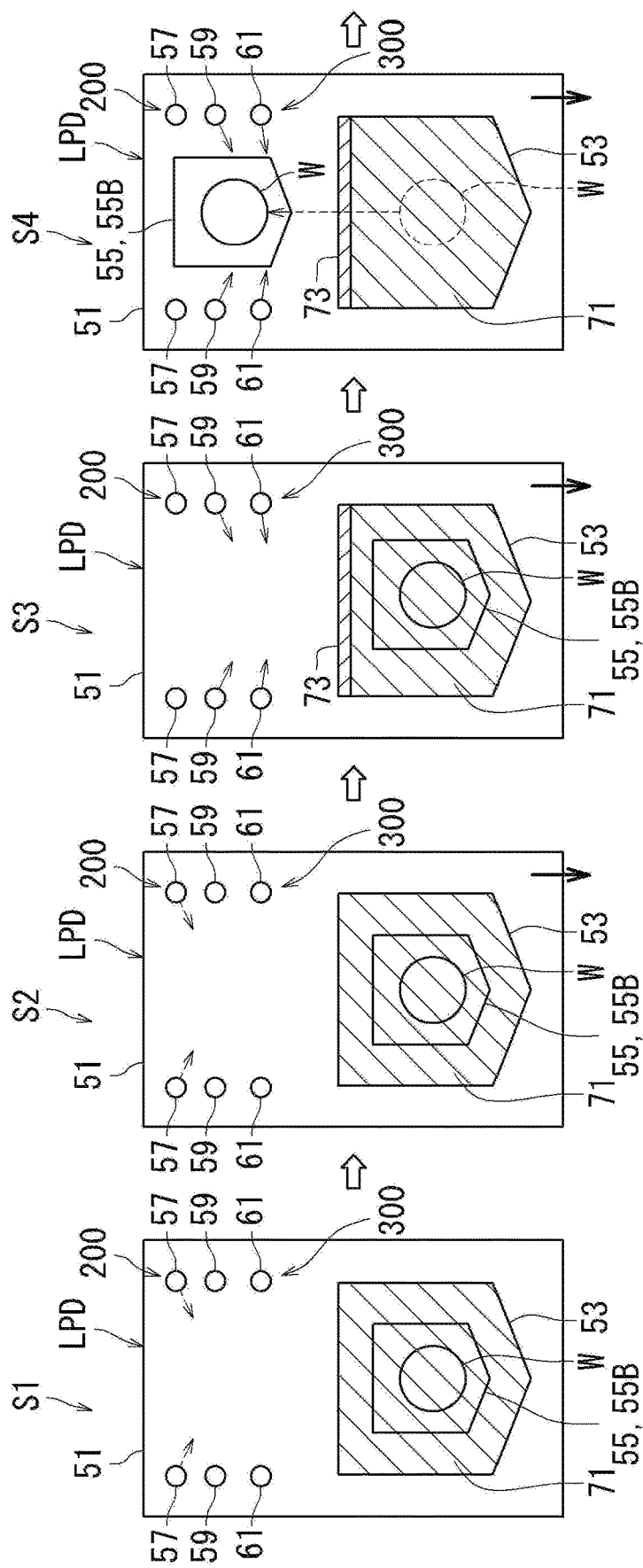
FIG. 4 is a sequence diagram showing a front stage of a substrate processing method which is performed by the substrate processing apparatus according to the first embodiment.
Figure 5:
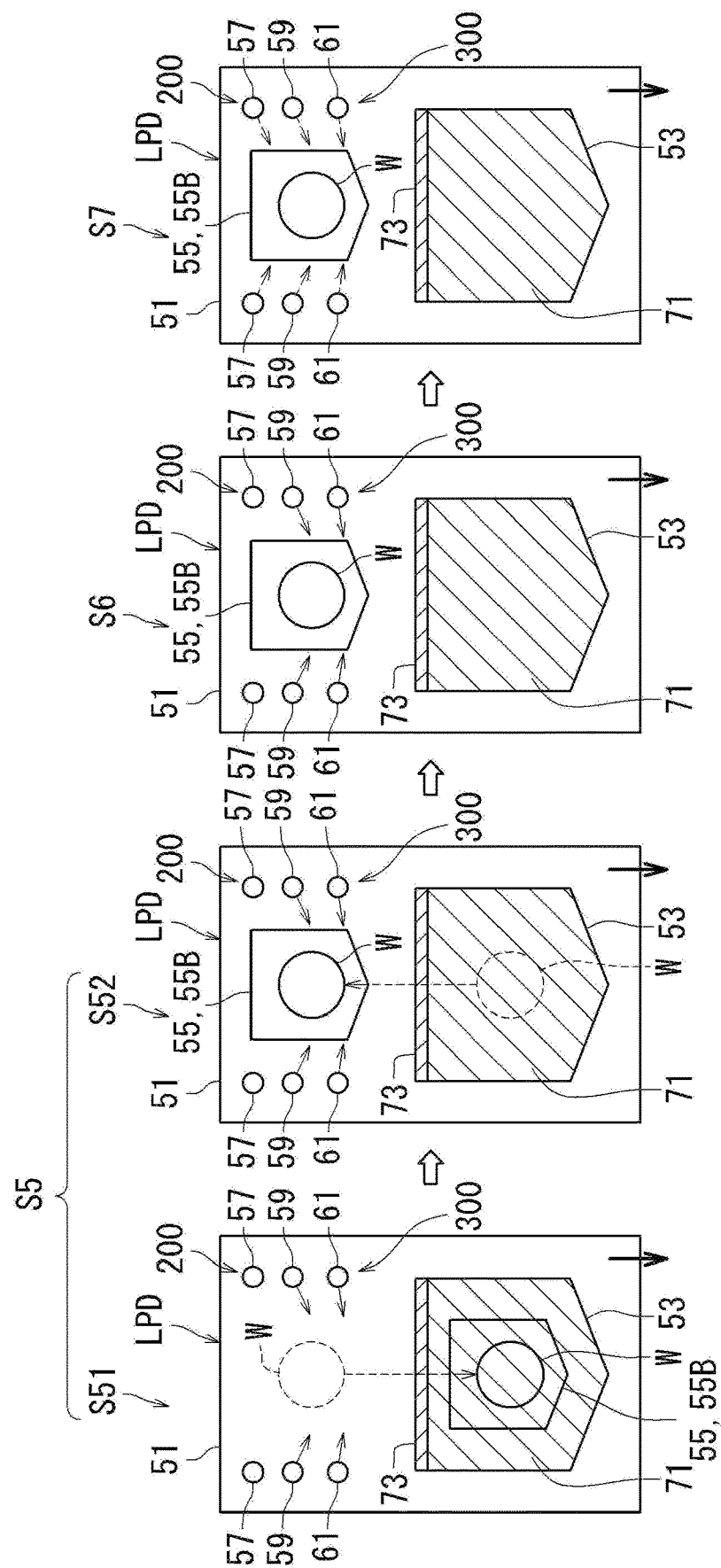
FIG. 5 is a sequence diagram showing a rear stage of the substrate processing method which is performed by the substrate processing apparatus according to the first embodiment.

Next, a substrate processing method which is performed by the substrate processing apparatus 1000 will be described with reference to FIGS. 4 and 5 and (a) to (d) of FIG. 6. FIGS. 4 and 5 are sequence diagrams showing a substrate processing method according to the first embodiment. In FIGS. 4 and 5, the thickness of the film 73 to be described later is exaggerated to make the drawings easier to see. (a) to (d) of FIG. 6 are diagrams showing a principle that the rinsing liquid remaining between the structures 504 of the substrate W is replaced with the organic solvent. In (a) to (d) of FIG. 6, the structure 504 in an area A of FIG. 3 is enlarged and shown.

As shown in FIGS. 4 and 5, the substrate processing method includes step S1 to step S7. The substrate moving section 55, the inert gas supply section 200, and the fluid supply section 300 are controlled by the control device 100 to perform step S1 to step S7.

First, in step S1, the inert gas supply section 200 (specifically, the nozzle 57) supplies the inert gas into the chamber 51 while the substrate W is immersed in the rinsing liquid 71 of the tank 53.

Next, in step S2, the decompression section 600 decompresses the inside of the chamber 51 while continuously supplying the inert gas. As a result, the atmosphere in the chamber 51 is replaced with the inert gas. The substrate W is continuously immersed in the rinsing liquid 71.

Next, in step S3, the inert gas supply section 200 (specifically, the nozzle 57) stops the supply of the inert gas into the chamber 51. Then, the fluid supply section 300 (specifically, the nozzles 59 and 61) supplies the vapor of the organic solvent into the chamber 51 while being continuously decompressed. As a result, the atmosphere of the vapor of the organic solvent is formed in the chamber 51. Further, in step S3, the film 73 of the organic solvent is formed on the liquid surface of the rinsing liquid 71 by the vapor of the organic solvent. The function of the film 73 will be described later. The substrate W is continuously immersed in the rinsing liquid 71.

Next, in step S4, the substrate moving section 55 raises the substrate holding section 55B to raise the substrate W and lift the substrate W from the rinsing liquid 71 stored in the tank 53 in a state in which the decompression and the supply of the vapor of the organic solvent are continued. As a result, the substrate W is located above the tank 53 in the chamber 51.

In step S4, as an example, the rinsing liquid 71 remains in the space SP between the structures 504 of the substrate W as shown in (a) of FIG. 6 immediately after the substrate W is lifted from the rinsing liquid 71.

Then, in step S4, the organic solvent adheres (condenses) to the surface of the substrate W since the atmosphere of the vapor of the organic solvent is formed in the chamber 51. Thus, as shown in (b) of FIG. 6, as an example, the organic solvent 72 invades the space SP between the structures 504 of the substrate W to cover the rinsing liquid 71. In the example of (b) of FIG. 6, the rinsing liquid 71 and the organic solvent 72 are hardly mixed.

Next, as shown in FIG. 5, in step S5, the substrate moving section 55 immerses the substrate W in the rinsing liquid 71 stored in the tank 53 in the chamber 51 while the organic solvent adheres to the substrate W and lifts the substrate in a state in which the decompression and the supply of the vapor of the organic solvent are continued. As a result, the rinsing liquid 71 and the organic solvent 72 shown in (b) of FIG. 6 are stirred in the space SP between the structures 504 of the substrate W.

That is, in step S5, as shown in (c) of FIG. 6, as an example, the rinsing liquid 71 and the organic solvent 72 are mixed in the space SP between the structures 504 of the substrate W to form the diluted organic solvent 75. That is, step S5 is a step of forming the diluted organic solvent 75 in the space SP between the structures 504 of the substrate W.

Specifically, step S5 includes step S51 and step S52.

In step S51, the substrate moving section 55 lowers the substrate holding section 55B to lower the substrate W and immerses the substrate W having the organic solvent adhering thereto in the rinsing liquid 71 in the tank 53 in a state in which the decompression and the supply of the vapor of the organic solvent are continued.

Next, in step S52, the substrate moving section 55 raises the substrate holding section 55B to raise the substrate W and lift the substrate W from the rinsing liquid 71 in a state in which the decompression and the supply of the vapor of the organic solvent are continued.

Next, in step S6, the fluid supply section 300 (specifically, the nozzles 59 and 61) supplies the vapor of the organic solvent into the chamber 51 in which the substrate W lifted by step S52 exists continuously from step S52 in a state in which the decompression is continued. Thus, the organic solvent adheres (condenses) to the surface of the substrate W.

In step S6, as shown in (d) of FIG. 6, as an example, the organic solvent adhering (condensing) to the surface of the substrate W is mixed with the diluted organic solvent 75 in the space SP between the structures 504 of the substrate W to form the high concentration organic solvent 77.

Next, in step S7, the inert gas supply section 200 (specifically, the nozzle 57) and the fluid supply section 300 (specifically, the nozzles 59 and 61) supply the inert gas into the chamber 51 in a state in which the decompression is continued. As a result, the high concentration organic solvent 77 between the structures 504 of the substrate W is vaporized and the substrate W is dried. Then, the drying process according to the substrate processing method is completed.

As described above with reference to FIG. 5, according to the first embodiment, in step S4, the substrate W immersed in the rinsing liquid 71 is lifted from the rinsing liquid 71 and in step S5, the substrate moving section 55 performs an operation in which the substrate W is immersed in the rinsing liquid 71 stored in the tank 53 in the chamber 51 while the organic solvent adheres to the substrate W and an operation in which the substrate W is lifted from the rinsing liquid 71. Specifically, the substrate moving section 55 immerses the substrate W in the rinsing liquid 71 stored in the tank 53 in the chamber 51 while the organic solvent adheres to the substrate W in step S51 after the substrate W immersed in the rinsing liquid 71 is lifted from the rinsing liquid 71 in step S4. Then, in step S52, the substrate W is lifted from the rinsing liquid 71.

Thus, as shown in (b) of FIG. 6 and (c) of FIG. 6, the rinsing liquid 71 and the organic solvent 72 are stirred in the space SP between the structures 504 of the substrate W to form the diluted organic solvent 75 in the space SP. Then, in step S6, the fluid supply section 300 supplies the vapor of the organic solvent into the chamber 51. Thus, the organic solvent adhering (condensing) to the surface of the substrate W is rapidly mixed with the diluted organic solvent 75 (see the second experiment). As a result, as shown in (d) of FIG. 6, the high concentration organic solvent 77 is formed in the space SP between the structures 504 of the substrate W.

That is, according to the first embodiment, it is possible to effectively replace the rinsing liquid 71 existing in the space SP between the structure 504 and the structure 504 formed on the surface of the substrate W with the high concentration organic solvent 77 by performing step S51, step S52, and step S6. As a result, it is possible to effectively suppress the collapse of the structure 504 at the time of drying the substrate W.

Particularly, in the first embodiment, in step S4, the substrate W immersed in the rinsing liquid 71 is lifted from the rinsing liquid 71 and in step S51, the substrate moving section 55 immerses the substrate W in the rinsing liquid 71 having the film 73 of the organic solvent on the liquid surface while the substrate passes through the film 73. Then, in step S52, the substrate moving section 55 lifts the substrate W from the rinsing liquid 71 while the substrate passes through the film 73 of the organic solvent. That is, the substrate moving section 55 performs an operation in which the substrate W is immersed in the rinsing liquid 71 having the film 73 of the organic solvent on the liquid surface and an operation in which the substrate W is lifted from the rinsing liquid 71 while the substrate passes through the film 73 of the organic solvent after the substrate W immersed in the rinsing liquid 71 is lifted from the rinsing liquid 71.

Specifically, in steps S3 and S4 before step S51, that is, before the substrate moving section 55 performs an operation in which the substrate W is immersed in the rinsing liquid 71, the fluid supply section 300 forms the film 73 of the organic solvent on the liquid surface of the rinsing liquid 71 in the tank 53 by the vapor of the organic solvent. Thus, in step S51, the substrate W passes through the film 73 while stirring the film 73 of the organic solvent at the time of immersing the substrate W in the rinsing liquid 71. Then, since the stirred organic solvent diffuses in the rinsing liquid 71, the distribution of the organic solvent spreads downward from the position of the initial film 73. The distribution degree of the organic solvent is determined by, for example, the amount of the organic solvent forming the film 73 (the thickness of the film 73) and the descending speed of the substrate W.

Then, the mixing of the rinsing liquid 71 and the organic solvent 72 (the organic solvent adhering to the substrate W and the organic solvent from the film 73 in step S4) is further promoted in the space SP between the structures 504 of the substrate W due to the existence of the organic solvent from the film 73 in the rinsing liquid 71 in the tank 53, so that the diluted organic solvent 75 ((c) of FIG. 6) can be more effectively formed. As a result, in step S6, the organic solvent from the fluid supply section 300 is more effectively mixed with the diluted organic solvent 75 existing in the space SP between the structures 504 of the substrate W to form the high concentration organic solvent 77 ((d) of FIG. 6) (see the second experiment). As a result, it is possible to more effectively suppress the collapse of the structure 504 at the time of drying the substrate W.

Additionally, in step S4 and step S52, the substrate W passes through the film 73 of the organic solvent when the substrate W is lifted from the rinsing liquid 71. Thus, the organic solvent adheres to the surface of the substrate W. The organic solvent in this case can also contribute to the replacement of the rinsing liquid 71 with the organic solvent in the space SP between the structures 504 of the substrate W.

Further, in the first embodiment, the fluid supply section 300 supplies the vapor of the organic solvent into the chamber 51 before step S51, that is, before the substrate moving section 55 performs an operation in which the substrate W is immersed in the rinsing liquid 71. Thus, as shown in (b) of FIG. 6, the organic solvent 72 invades the space SP between the structures 504 of the substrate W. As a result, the preparation for mixing the rinsing liquid 71 and the organic solvent 72 by step S51 and step S52 is completed.

Further, in the first embodiment, it is preferable that the substrate moving section 55 sets the descending speed of the substrate W when the substrate W is immersed in the rinsing liquid 71 in step S51 to be larger than the ascending speed of the substrate W when the substrate W is lifted from the rinsing liquid 71 in step S52. According to this preferred example, as shown in (b) of FIG. 6 and (c) of FIG. 6, the rinsing liquid 71 and the organic solvent 72 can be effectively stirred in the space SP between the structures 504 of the substrate W so that the diluted organic solvent 75 is more rapidly formed.

Further, in the first embodiment, it is preferable that the substrate moving section 55 performs step S5 a plurality of times. Specifically, it is preferable to alternately perform step S51 and step S52 a plurality of times. That is, it is preferable that the substrate moving section 55 alternately performs an operation in which the substrate W is immersed in the rinsing liquid 71 and an operation in which the substrate W is lifted from the rinsing liquid 71 a plurality of times. According to this preferred example, it is possible to further promote the mixing of the rinsing liquid 71 and the organic solvent 72 in the space SP between the structures 504 of the substrate W and to more effectively form the diluted organic solvent 75.

In this case, it is preferable that the substrate moving section 55 sets the ascending speed of the substrate W in the last step S52 among the steps S52 performed a plurality of times to be smaller than the ascending speed of the substrate W in the other steps S52. Specifically, in the final step S52 among the steps S52 performed a plurality of times, it is preferable that the substrate moving section 55 minimizes the ascending speed of the substrate W when the substrate W is lifted from the rinsing liquid 71. That is, it is preferable that the ascending speed of the substrate W when the substrate W is lifted from the rinsing liquid 71 is the smallest in the final operation when the substrate moving section 55 performs an operation of immersing the substrate W in the rinsing liquid 71 a plurality of times. According to this preferred example, it is possible to reduce the amount of the rinsing liquid 71 adhering to the substrate W at the time of lifting the substrate W. As a result, in step S6, it is possible to more effectively replace the organic solvent in the space SP between the structures 504 of the substrate W. Additionally, in the final step S51 among the steps S51 performed a plurality of times, the substrate moving section 55 may also minimize the descending speed of the substrate W when the substrate W is immersed in the rinsing liquid 71.

Further, in the steps S5 other than the final step S5 among the steps S5 performed a plurality of times, it is possible to improve the processing throughput of the substrate W by increasing the descending speed and/or the ascending speed of the substrate W as compared with the final step S5.

As described above with reference to FIGS. 4 to 6, in the first embodiment, it is possible to suppress the insufficient replacement of the rinsing liquid 71 with the organic solvent in the space SP between the structures 504 of the substrate W and to suppress the uneven condensation of the organic solvent in the plurality of spaces SP of the plurality of structures 504 by the film 73 of the organic solvent formed on the liquid surface of the rinsing liquid 71 in the tank 53 (step S3) and the atmosphere of the vapor of the organic solvent in the chamber 51 formed by steps S51 and S52 and the fluid supply section 300 (step S6).

If the insufficient replacement of the rinsing liquid 71 with the organic solvent in the space SP between the structures 504 of the substrate W can be suppressed, the surface tension applied to the structure 504 can be decreased. As a result, it is possible to effectively suppress the collapse of the structure 504 at the time of drying the substrate W. Further, if the uneven condensation of the organic solvent can be suppressed in the plurality of spaces SP of the plurality of structures 504, it is possible to suppress a large difference in drying rate and/or difference in surface tension among the plurality of structures 504. As a result, it is possible to effectively suppress the collapse of the structure 504 at the time of drying the substrate W.

Here, the organic solvent of steps S3 and S4 corresponds to an example of the "first organic solvent". Further, the organic solvent in steps S51, S52, and S6 corresponds to an example of the "second organic solvent". In the first embodiment, since the nozzles 59 and 61 of the fluid supply section 300 supply the vapor of the organic solvent into the chamber 51, the "first organic solvent" and the "second organic solvent" are the same. The "first organic solvent" and the "second organic solvent" are, for example, IPA.

Further, the phenomenon shown in (a) to (d) of FIG. 6 may not occur in all of the plurality of spaces SP in the plurality of structures 504 of the substrate W and the phenomenon shown in (a) to (d) of FIG. 6 may occur in the space SP of at least a part of the plurality of structures 504. Also in this case, the collapse of the structure 504 when the substrate W is dried can be suppressed as compared with the case where the substrate processing method does not include step S6.

Additionally, the rinsing liquid 71 in the tank 53 may be heated below the boiling point of the organic solvent by a heater (not shown). Further, steps S5 to S7 of the drying tank unit LPD may be performed, for example, after the substrate W is cleaned by the rinsing liquid in the tank units ONB and CHB, that is, after the substrate W immersed in the rinsing liquid is lifted in the tank units ONB and CHB.

Next, another example of the substrate processing method according to the first embodiment will be described with reference to FIGS. 1, 2, 7, and 8. FIGS. 7 and 8 are flowcharts showing another example of the substrate processing method which is performed by the substrate processing apparatus 1000. As shown in FIGS. 7 and 8, the substrate processing method includes steps S11 to S26. The second transfer mechanism WTR, the transfer mechanism LF, the tank units CHB and ONB, the substrate moving section 55, the inert gas supply section 200, the decompression section 600, the fluid supply section 300, and the hydrophobizing agent supply section 700 shown in FIGS. 1 and 2 are controlled by the control device 100 to perform steps S11 to S26.

As shown in FIG. 7, first, in step S11, the second transfer mechanism WTR carries, for example, the substrate W into the tank unit CHB of the first processing section 19. Then, the tank unit CHB immerses the substrate W into the chemical solution in the tank to process the substrate W.

Next, in step S12, the transfer mechanism LF carries, for example, the substrate W out of the tank unit CHB and carries the substrate W into the tank unit ONB of the first processing section 19. Then, the tank unit ONB immerses the substrate W in the rinsing liquid in the tank to clean the substrate W.

Next, in step S13, the second transfer mechanism WTR carries the substrate W out of the tank unit ONB and carries the substrate W into the drying tank unit LPD. Then, the substrate moving section 55 immerses the substrate W in the rinsing liquid in the tank 53. Then, the nozzle 57 of the inert gas supply section 200 starts the supply of the inert gas into the chamber 51 after the substrate W is immersed in the rinsing liquid in the tank 53. For example, step S13 corresponds to step S1 of FIG. 4.

Next, in step S14, the decompression section 600 decompresses the inside of the chamber 51 while continuously supplying the inert gas. As a result, the atmosphere in the chamber 51 is replaced with the inert gas. For example, step S14 corresponds to step S2 of FIG. 4.

Next, in step S15, the nozzle 57 of the inert gas supply section 200 stops the supply of the inert gas into the chamber 51. Then, the nozzles 59 and 61 of the fluid supply section 300 start the supply of the organic solvent into the chamber 51 in a state in which the decompression is continued. As a result, the atmosphere of the vapor of the organic solvent is formed in the chamber 51. Further, when the vapor of the organic solvent adheres to the liquid surface of the rinsing liquid in the tank 53, the film (for example, the film 73 of FIGS. 4 and 5) of the organic solvent is formed on the liquid surface of the rinsing liquid in the tank 53. For example, step S15 corresponds to step S3 of FIG. 4.

Next, in step S16, the substrate moving section 55 raises the substrate W to lift the substrate W from the rinsing liquid stored in the tank 53 in a state in which the decompression and the supply of the vapor of the organic solvent are continued. As a result, the substrate W is located above the tank 53 in the chamber 51. Then, the organic solvent adheres (condenses) to the surface of the substrate W. For example, step S16 corresponds to step S4 of FIG. 4.

Next, in step S17, the substrate moving section 55 immerses the substrate W in the rinsing liquid stored in the tank 53 in the chamber 51 while the organic solvent adheres to the substrate W and lifts the substrate in a state in which the decompression and the supply of the vapor of the organic solvent are continued. As a result, the rinsing liquid and the organic solvent are stirred in the space SP between the structures 504 of the substrate W and the diluted organic solvent (for example, the diluted organic solvent 75 of (c) of FIG. 6) is formed. For example, step S17 corresponds to step S5 of FIG. 5.

Specifically, step S17 includes step S171 and step S172.

In step S171, the substrate moving section 55 lowers the substrate W to immerse the substrate W having the organic solvent adhering thereto in the rinsing liquid in the tank 53 in a state in which the decompression and the supply of the vapor of the organic solvent are continued. In this case, the substrate W having the organic solvent adhering thereto passes through the film of the organic solvent formed on the liquid surface of the rinsing liquid in the tank 53. For example, step S171 corresponds to step S51 of FIG. 5.

Next, in step S172, the substrate moving section 55 raises the substrate W to lift the substrate W from the rinsing liquid in a state in which the decompression and the supply of the vapor of the organic solvent are continued. In this case, the substrate W passes through the film of the organic solvent formed on the liquid surface of the rinsing liquid in the tank 53. For example, step S172 corresponds to step S52 of FIG. 5.

Next, in step S18, the control device 100 determines whether or not step S17 has been performed a predetermined number of times. The predetermined number of times may be 1 or 2 or more.

If a negative determination (No) is made in step S18, step S17 is performed again. That is, step S17 is repeated until a positive determination (Yes) is made in step S18. The negative determination indicates that step S17 has not been performed a predetermined number of times. The positive determination indicates that step S17 has been performed a predetermined number of times.

On the other hand, when a positive determination (Yes) is made in step S18, the process proceeds to step S19.

Next, in step S19, the nozzles 59 and 61 of the fluid supply section 300 supply the vapor of the organic solvent into the chamber 51 in which the substrate W lifted by step S172 exists continually from step S172 in a state in which the decompression is continued. Thus, the organic solvent adheres (condenses) to the surface of the substrate W. As a result, the diluted organic solvent (for example, the diluted organic solvent 75 of (c) of FIG. 6) existing in the space SP between the structures 504 of the substrate W and the organic solvent adhering (condensing) to the surface of the substrate W are rapidly mixed. As a result, the high concentration organic solvent (for example, the high concentration organic solvent 77 of (d) of FIG. 6) can be formed in the space SP between the structures 504 of the substrate W. For example, step S19 corresponds to step S6 of FIG. 5.

Next, as shown in FIG. 8, in step S20, the drainage section 450 discharges the rinsing liquid in the tank 53 in a state in which the decompression and the supply of the organic solvent are continued. Since the hydrophobizing agent used in the next step S21 reacts with the rinsing liquid and is inactivated, the liquid is discharged from the tank 53 in advance in step S20.

Next, in step S21, the nozzle 63 of the hydrophobizing agent supply section 700 starts the supply of the vapor of the hydrophobizing agent into the chamber 51 in a state in which the decompression and the supply of the vapor of the organic solvent are continued. In step S21, the hydrophobizing agent can be easily supplied in the form of vapor by continuing the decompression.

Next, in step S22, the nozzles 59 and 61 of the fluid supply section 300 stop the supply of the vapor of the organic solvent in a state in which the decompression and the supply of the hydrophobizing agent are continued. As a result, the organic solvent existing on the surface of the substrate W is replaced with the hydrophobizing agent. In the first embodiment, it is possible to replace the organic solvent existing on the surface of the substrate W with the hydrophobizing agent while reducing the usage amount of the hydrophobizing agent by supplying the vapor of the hydrophobizing agent. The hydrophobizing agent preferably has a boiling point of room temperature or higher in order to cause dew condensation on the surface of the substrate W.

Next, in step S23, the nozzles 59 and 61 of the fluid supply section 300 start the supply of the vapor of the organic solvent in a state in which the decompression and the supply of the hydrophobizing agent are continued.

Next, in step S24, the nozzle 63 of the hydrophobizing agent supply section 700 stops the supply of the hydrophobizing agent in a state in which the decompression and the supply of the vapor of the organic solvent are continued. In step S24, the atmosphere in the chamber 51 is replaced from the hydrophobizing agent to the vapor of the organic solvent. As a result, the hydrophobizing agent existing on the surface of the substrate W is replaced with the organic solvent.

Next, in step S25, the nozzles 59 and 61 of the fluid supply section 300 stop the supply of the vapor of the organic solvent in a state in which the decompression is continued. In addition, the nozzle 57 of the inert gas supply section 200 and the nozzles 59 and 61 of the fluid supply section 300 start the supply of the inert gas in a state in which the decompression is continued. Thus, the atmosphere in the chamber 51 is replaced from the vapor of the organic solvent to the inert gas. As a result, the substrate W is dried.

Next, in step S26, the decompression section 600 stops the decompression after the substrate W is dried. In step S26, the supply of the inert gas is continued to increase the inner pressure of the chamber 51 to the atmospheric pressure. Then, the substrate processing method ends.

As described above with reference to FIGS. 7 and 8, according to the first embodiment, it is possible to replace the organic solvent on the surface of the substrate W with the hydrophobizing agent while reducing the usage amount of the hydrophobizing agent by supplying the vapor of the hydrophobizing agent in steps S21 and S22. Further, if the substrate W to which water (rinsing liquid) adheres is brought into direct contact with the hydrophobizing agent, the reforming performance may be deteriorated or foreign matter may be generated. In contrast, in the first embodiment, the rinsing liquid is removed from the surface of the substrate W by replacing the rinsing liquid with the organic solvent in step S19 before the hydrophobizing process of step S22 starts. In this way, since the hydrophobizing process of step S22 is performed on the substrate W from which the rinsing liquid is removed, the hydrophobizing agent and the rinsing liquid do not contact each other in the hydrophobizing process and hence the deactivation of the hydrophobizing agent and the generation of foreign matter can be suppressed. Further, the decompression and the supply of the organic solvent are continued in step S21, so that the surface of the substrate W is dried and the collapse of the structure 504 formed on the surface is prevented. Furthermore, since there is a possibility that foreign matter may remain on the surface of the substrate W when the substrate is dried while the hydrophobizing agent remains on the surface of the substrate W, the surface of the substrate W is replaced with the organic solvent again in step S24. In this case, it is presumed that the surface of the substrate W has hydrophobicity and the surface tension generated by the organic solvent between the structures 504 of the surface of the substrate W is further reduced and the collapse of the structure 504 of the substrate W can be suppressed even if the substrate is finally dried.

Here, the organic solvent in steps S15 and S16 corresponds to an example of the "first organic solvent". Further, the organic solvent in steps S17 to S19 corresponds to an example of the "second organic solvent". In the first embodiment, since the nozzles 59 and 61 of the fluid supply section 300 supply the vapor of the organic solvent into the chamber 51, the "first organic solvent" and the "second organic solvent" are the same.

Additionally, for example, the hydrophobizing process (steps S21 and S22) may be performed by the tanks different from the tank 53 of the drying tank unit LPD (for example, the tank of the tank unit CHB or the tank of the tank unit ONB). Further, for example, the rinsing liquid in the tank 53 may be heated below the boiling point of the organic solvent by a heater (not shown).

Further, when steps S11 and S12 are regarded as one set, a plurality of sets may be performed as the substrate processing method. For example, the tank unit CHB of the second processing section 21 immerses the substrate W in the first chemical solution in the tank to process the substrate W. The first chemical solution is, for example, an aqueous phosphoric acid solution. Next, for example, the tank unit ONB of the second processing section 21 immerses the substrate W in the rinsing liquid in the tank to clean the substrate W. Next, for example, the tank unit CHB of the first processing section 19 immerses the substrate W in the second chemical solution in the tank to process the substrate W. The second chemical solution is, for example, SC1. Next, for example, the tank unit ONB of the first processing section 19 immerses the substrate W in the rinsing liquid in the tank to clean the substrate W.

Second Embodiment

The substrate processing apparatus 1000 and the substrate processing method according to a second embodiment of the disclosure will be described with reference to FIGS. 1, 2, 3, 6, 9, and 10. The second embodiment is mainly different from the first embodiment in that the organic solvent is directly supplied to the rinsing liquid in the tank 53 to form the film 73 in the substrate processing apparatus 1000 and the substrate processing method according to the second embodiment. The configuration of the substrate processing apparatus 1000 according to the second embodiment is the same as the configuration of the substrate processing apparatus 1000 described with reference to FIGS. 1 and 2. Thus, FIGS. 1 and 2 are appropriately referred in the description of the second embodiment. Further, the substrate W shown in FIG. 3 is exemplified as an example of a processing target. Hereinafter, the difference between the second embodiment and the first embodiment will be mainly described.

FIGS. 9 and 10 are sequence diagrams showing the substrate processing method according to the second embodiment. The substrate processing method is performed by the substrate processing apparatus 1000. In FIGS. 9 and 10, the thickness of the film 73 is exaggerated to make the drawings easier to see.

As shown in FIGS. 9 and 10, the substrate processing method includes steps S1A to S7A. The substrate moving section 55, the inert gas supply section 200, and the fluid supply section 300 are controlled by the control device 100 to perform steps S1A to S7A.

First, in step S1A, the inert gas supply section 200 (specifically, the nozzle 57) supplies the inert gas into the chamber 51 while the substrate W is immersed in the rinsing liquid 71 of the tank 53.

Next, in step S2A, the decompression section 600 decompresses the inside of the chamber 51 while continuously supplying the inert gas. As a result, the atmosphere in the chamber 51 is replaced with the inert gas. The substrate W is continuously immersed in the rinsing liquid 71.

Next, in step S3A, the inert gas supply section 200 (specifically, the nozzle 57) stops the supply of the inert gas into the chamber 51. Then, the fluid supply section 300 (specifically, the nozzle 65) forms the film 73 of the organic solvent on the liquid surface of the rinsing liquid 71 by directly supplying the organic solvent to the rinsing liquid 71 stored in the tank 53 in a state in which the decompression is continued. In the first embodiment, the fluid supply section 300 (specifically, the nozzle 65) forms the film 73 of the organic solvent on the liquid surface of the rinsing liquid 71 by directly supplying the liquid of the organic solvent to the rinsing liquid 71 stored in the tank 53. The substrate W is continuously immersed in the rinsing liquid 71.

Next, in step S4A, the fluid supply section 300 (specifically, the nozzle 65) stops the supply of the organic solvent. Then, in a state in which the decompression is continued, the substrate moving section 55 raises the substrate holding section 55B to raise the substrate W and lift the substrate W from the rinsing liquid 71 stored in the tank 53. As a result, the substrate W is located above the tank 53 in the chamber 51. In this case, as shown in the case of (a) of FIG. 6, the rinsing liquid 71 remains in the space SP between the structures 504 of the substrate W. Further, since the substrate W passes through the film 73 when the substrate is raised, the organic solvent adheres to the surface of the substrate W.

Next, as shown in FIG. 10, in step S5A, the substrate moving section 55 immerses the substrate W in the rinsing liquid 71 stored in the tank 53 in the chamber 51 while the organic solvent adheres to the substrate W in a state in which the decompression is continued and lifts the substrate. As a result, the rinsing liquid 71 and the organic solvent are stirred in the space SP between the structures 504 of the substrate W. In this case, similarly to the case shown in (b) of FIG. 6 and (c) of FIG. 6, the rinsing liquid 71 and the organic solvent 72 are mixed in the space SP between the structures 504 of the substrate W to form the diluted organic solvent 75. That is, step S5A is a step of forming the diluted organic solvent 75 in the space SP between the structures 504 of the substrate W.

Specifically, step S5A includes step S51A and step S52A.

In step S51A, the substrate moving section 55 lowers the substrate holding section 55B to lower the substrate W and to immerse the substrate W in the rinsing liquid 71 in which the film 73 is formed in a state in which the decompression is continued.

Next, in step S52A, the fluid supply section 300 (specifically, the nozzles 59 and 61) supplies the vapor of the organic solvent into the chamber 51 while being continuously decompressed. As a result, the atmosphere of the vapor of the organic solvent is formed in the chamber 51.

Then, in a state in which the decompression is continued, the substrate moving section 55 raises the substrate holding section 55B to raise the substrate W and lift the substrate W from the rinsing liquid 71 in which the film 73 is formed.

Next, in step S6A, the fluid supply section 300 (specifically, the nozzles 59 and 61) supplies the vapor of the organic solvent into the chamber 51 in which the substrate W lifted by step S52A exists continuously from step S52A in a state in which the decompression is continued. Thus, the organic solvent adheres (condenses) to the surface of the substrate W. In this case, similarly to the case shown in (c) of FIG. 6 and (d) of FIG. 6, the organic solvent adhering (condensing) to the surface of the substrate W is mixed with the diluted organic solvent 75 to form the high concentration organic solvent 77 in the space SP between the structures 504 of the substrate W.

Next, in step S7A, the inert gas supply section 200 (specifically, the nozzle 57) and the fluid supply section 300 (specifically, the nozzles 59 and 61) supply the inert gas into the chamber 51 in a state in which the decompression is continued. As a result, the high concentration organic solvent 77 between the structures 504 of the substrate W is vaporized and the substrate W is dried. Then, the drying process according to the substrate processing method is completed.

As described above with reference to FIGS. 9 and 10, in the second embodiment, in step S4A, the substrate W immersed in the rinsing liquid 71 is lifted from the rinsing liquid 71 and in step S51A, the substrate moving section 55 immerses the substrate W in the rinsing liquid 71 having the film 73 of the organic solvent on the liquid surface while the substrate passed through the film 73. Then, in step S52A, the substrate moving section 55 lifts the substrate W from the rinsing liquid 71 while the substrate passes through the film 73 of the organic solvent.

Specifically, in step S3A before step S51A, the film 73 of the organic solvent is formed on the liquid surface of the rinsing liquid 71 in the tank 53. That is, the fluid supply section 300 forms the film 73 of the organic solvent on the liquid surface of the rinsing liquid 71 by directly supplying the organic solvent to the rinsing liquid 71 stored in the tank 53 before the substrate moving section 55 performs an operation in which the substrate W is immersed in the rinsing liquid 71. Thus, in step S51A, the substrate W passes through the film 73 while stirring the film 73 of the organic solvent at the time of immersing the substrate W in the rinsing liquid 71. Then, since the stirred organic solvent diffuses in the rinsing liquid 71, the distribution of the organic solvent spreads downward from the position of the initial film 73. This point is the same as that of the first embodiment.

Then, the organic solvent from the film 73 and the rinsing liquid 71 are mixed in the space SP between the structures 504 of the substrate W due to the existence of the organic solvent from the film 73 in the rinsing liquid 71 in the tank 53, so that the diluted organic solvent 75 (see (c) of FIG. 6) can be effectively formed. As a result, in step S6A, the organic solvent from the fluid supply section 300 is effectively mixed with the diluted organic solvent 75 existing in the space SP between the structures 504 of the substrate W to form the high concentration organic solvent 77 (see (d) of FIG. 6) by the same principle as the first embodiment (see the second experiment). As a result, it is possible to effectively suppress the collapse of the structure 504 at the time of drying the substrate W.

Additionally, in step S4A and step S52A, the substrate W passes through the film 73 of the organic solvent when the substrate W is lifted from the rinsing liquid 71. Thus, the organic solvent adheres to the surface of the substrate W. The organic solvent in this case can also contribute to the replacement of the rinsing liquid 71 with the organic solvent in the space SP between the structures 504 of the substrate W.

Further, in the second embodiment, similarly to the first embodiment, the substrate moving section 55 may set the descending speed of the substrate W when the substrate W is immersed in the rinsing liquid 71 in step S51A to be larger than the ascending speed of the substrate W when the substrate W is lifted from the rinsing liquid 71 in step S52A.

Further, in the second embodiment, similarly to the first embodiment, the substrate moving section 55 may alternately perform step S51A and step S2A a plurality of times. In this case, in the final step S52A among steps S52A performed a plurality of times, the substrate moving section 55 may minimize the ascending speed of the substrate W when the substrate W is lifted from the rinsing liquid 71. Further, in the final step S51A among steps S51A performed a plurality of times, the substrate moving section 55 may minimize the descending speed of the substrate W when the substrate W is immersed in the rinsing liquid 71.

Further, in the second embodiment, the fluid supply section 300 (specifically, the nozzles 59 and 61) may start the supply of the vapor of the organic solvent into the chamber 51 in steps S3A and S4A or step S51A. In this case, the fluid supply section 300 (specifically, the nozzles 59 and 61) continue the supply of the vapor of the organic solvent until step S6A after the supply of the vapor of the organic solvent starts.

Further, in step S3A, the nozzle 65 of the fluid supply section 300 may form the film of the organic solvent on the liquid surface of the rinsing liquid 71 by directly supplying the vapor of the organic solvent to the rinsing liquid 71 stored in the tank 53.

Here, the organic solvent in step S3A, that is, the organic solvent supplied by the nozzle 65 of the fluid supply section 300 corresponds to an example of the "first organic solvent". Further, the organic solvent in steps S52A and S6A, that is, the organic solvent supplied by the nozzles 59 and 61 of the fluid supply section 300 corresponds to an example of the "second organic solvent". In the second embodiment, the "first organic solvent" and the "second organic solvent" are different in terms of liquid and vapor. However, the type of "first organic solvent" and the type of "second organic solvent" are the same. For example, the "first organic solvent" and the "second organic solvent" are IPA.

Further, in the second embodiment, in step S5A, the diluted organic solvent 75 (see (c) of FIG. 6) may not be formed in all of the plurality of spaces SP of the plurality of structures 504 and the diluted organic solvent 75 may be formed in at least a part of the spaces SP of the plurality of structures 504.

Additionally, steps S5A to S7A of the drying tank unit LPD may be performed, for example, after the substrate W is cleaned by the rinsing liquid in the tank units ONB and CHB, that is, after the substrate W immersed in the rinsing liquid in the tank units ONB and CHB is lifted. Further, in the substrate processing method described with reference to FIGS. 7 and 8, steps S3A to S5A shown in FIGS. 9 and 10 may be performed instead of steps S15 to S17.

The embodiments of the disclosure have been described above with reference to the drawings. However, the disclosure is not limited to the above-described embodiments, and can be implemented in various forms without departing from the gist thereof. In addition, the plurality of components disclosed in the above-described embodiments can be appropriately modified. For example, one component of all components shown in one embodiment may be added to another component of another embodiment or some components of all components shown in one embodiment may be removed from the embodiment.

In the drawings, in order to facilitate understanding of the disclosure, each component is schematically shown, and the thickness, length, number, spacing, and the like of each component shown may differ from the actual one for the convenience of drawing creation. Further, the configuration of each component shown in the above embodiment is an example and is not particularly limited, and it goes without saying that various changes can be made without substantially deviating from the effects of the disclosure.

What is claimed is:

1. A substrate processing apparatus, comprising:
a chamber;
a tank which is disposed in the chamber;
a substrate moving section which performs a first lifting operation in which a substrate immersed in a rinsing liquid is lifted from the rinsing liquid, an immersion operation in which the substrate after the first lifting operation is immersed in a rinsing liquid stored in the tank while a first organic solvent having a surface tension smaller than that of the rinsing liquid adheres to the substrate, and a second lifting operation in which the substrate is lifted from the rinsing liquid stored in the tank;
a fluid supply section which supplies a vapor of a second organic solvent having a surface tension smaller than that of the rinsing liquid into the chamber in which the substrate lifted from the rinsing liquid by the second lifting operation by the substrate moving section exists;
a controller which is configured to control the substrate moving section and the fluid supply section; and
an inert gas supply section which supplies an inert gas into the chamber, wherein
the controller is configured to control:
the substrate moving section, after the first lifting operation, to perform the immersion operation while the first organic solvent adheres to the substrate;
the substrate moving section to perform the second lifting operation; and
the fluid supply section to supply the vapor of the second organic solvent into the chamber in which the substrate lifted from the rinsing liquid by the second lifting operation exists, and
the inert gas supply section does not supply the inert gas during a time between the first lifting operation and the second lifting operation.

2. The substrate processing apparatus according to claim 1,
wherein the fluid supply section supplies a vapor of the first organic solvent into the chamber before the substrate moving section performs the immersion operation in which the substrate is immersed in the rinsing liquid, and
wherein in the immersion operation, the substrate moving section lowers the substrate so that the substrate having the first organic solvent adhering thereto is immersed in the rinsing liquid.

3. The substrate processing apparatus according to claim 2,
wherein the fluid supply section forms a film of the first organic solvent on a liquid surface of the rinsing liquid by the vapor of the first organic solvent before the substrate moving section performs the immersion operation in which the substrate is immersed in the rinsing liquid.

4. The substrate processing apparatus according to claim 1,
wherein the fluid supply section forms a film of the first organic solvent on a liquid surface of the rinsing liquid by directly supplying the first organic solvent to the rinsing liquid stored in the tank before the substrate moving section performs the immersion operation in which the substrate is immersed in the rinsing liquid, and
wherein in the immersion operation, the substrate moving section lowers the substrate so that the substrate is immersed in the rinsing liquid having the film of the first organic solvent.

5. The substrate processing apparatus according to claim 1,
wherein the immersion operation in which the substrate is immersed in the rinsing liquid and the second lifting operation in which the substrate is lifted from the rinsing liquid are alternately performed by the substrate moving section a plurality of times.

6. The substrate processing apparatus according to claim 5,
wherein in the second lifting operation in which the substrate moving section lifts the substrate and which is performed finally, an ascending speed of the substrate when the substrate is lifted from the rinsing liquid is the smallest.

7. The substrate processing apparatus according to claim 1,
wherein a descending speed of the substrate when the substrate moving section immerses the substrate in the rinsing liquid in the immersion operation is set to be larger than an ascending speed of the substrate when the substrate moving section lifts the substrate from the rinsing liquid in the second lifting operation.

8. The substrate processing apparatus according to claim 1, wherein
the fluid supply section includes a first nozzle and a second nozzle that are disposed in the chamber,
the first nozzle is disposed on one side of a paired side walls of the chamber, and supplies the vapor of the second organic solvent to the substrate from the one side thereof in a state in which an inside of the chamber is decompressed to be smaller than an atmospheric pressure, and
the second nozzle is disposed on another one side of the paired side walls of the chamber, and supplies the vapor of the second organic solvent to the substrate from the another one side thereof in a state in which the inside of the chamber is decompressed to be smaller than the atmospheric pressure.

9. A substrate processing apparatus comprising:
a substrate moving section which performs a first lifting operation in which a substrate immersed in a rinsing liquid is lifted from the rinsing liquid, an immersion operation in which the substrate after the first lifting operation is immersed in a rinsing liquid having a film of a first organic solvent having a surface tension smaller than that of the rinsing liquid on a liquid surface while the substrate passes through the film of the first organic solvent, and a second lifting operation in which the substrate is lifted from the rinsing liquid while the substrate passes through the film of the first organic solvent;

a fluid supply section which supplies a vapor of a second organic solvent having a surface tension smaller than that of the rinsing liquid into a chamber in which the substrate lifted from the rinsing liquid by the second lifting operation by the substrate moving section exists;

a controller which is configured to control the substrate moving section and the fluid supply section; and an inert gas supply section which supplies an inert gas into the chamber, wherein the controller is configured to control the substrate moving section to perform the immersion operation after the first lifting operation, the substrate moving section to perform the second lifting operation, and the fluid supply section to supply the vapor of the second organic solvent into the chamber in which the substrate lifted from the rinsing liquid by the second lifting operation exists, and the inert gas supply section does not supply the inert gas during a time between the first lifting operation and the second lifting operation.

10. The substrate processing apparatus according to claim 9, wherein the fluid supply section includes a first nozzle and a second nozzle that are disposed in the chamber, the first nozzle is disposed on one side of a paired side walls of the chamber, and supplies the vapor of the second organic solvent to the substrate from the one side thereof in a state in which an inside of the chamber is decompressed to be smaller than an atmospheric pressure, and the second nozzle is disposed on another one side of the paired side walls of the chamber, and supplies the vapor of the second organic solvent to the substrate from the another one side thereof in a state in which the inside of the chamber is decompressed to be smaller than the atmospheric pressure.

\* \* \* \* \*